(12) United States Patent
Morikawa et al.

(10) Patent No.: US 10,553,519 B2
(45) Date of Patent: Feb. 4, 2020

(54) HEAT RADIATING MEMBER AND METHOD FOR PRODUCING THE SAME

(71) Applicants: A.L.M.T. Corp., Tokyo (JP); Sumitomo Electric Industries, Ltd., Osaka-shi (JP)

(72) Inventors: Tatsuya Morikawa, Toyama (JP); Takanori Kadokura, Toyama (JP); Isao Iwayama, Osaka (JP)

(73) Assignees: A.L.M.T. Corp, Tokyo (JP); Sumitomo Electric Industries, Ltd., Osaka-shi (JP)

( * ) Notice: Subject to any disclaimer, the term of this patent is extended or adjusted under 35 U.S.C. 154(b) by 182 days.

(21) Appl. No.: 15/507,938

(22) PCT Filed: Sep. 1, 2015

(86) PCT No.: PCT/JP2015/074881
§ 371 (c)(1),
(2) Date: Mar. 1, 2017

(87) PCT Pub. No.: WO2016/035796
PCT Pub. Date: Mar. 10, 2016

(65) Prior Publication Data
US 2017/0287810 A1    Oct. 5, 2017

(30) Foreign Application Priority Data
Sep. 2, 2014 (JP) ................................ 2014-178594

(51) Int. Cl.
F28F 7/00    (2006.01)
H01L 23/373    (2006.01)
(Continued)

(52) U.S. Cl.
CPC ............ *H01L 23/3735* (2013.01); *B22F 3/14* (2013.01); *B22F 3/16* (2013.01); *F28F 21/00* (2013.01);
(Continued)

(58) Field of Classification Search
CPC ............ H01L 23/3735; H01L 21/4871; H01L 23/3732; H01L 2924/0002; H01L 23/473;
(Continued)

(56) References Cited

U.S. PATENT DOCUMENTS 5,008,737 A    4/1991   Burnham et al.
5,130,771 A    7/1992   Burnham et al.
(Continued)

FOREIGN PATENT DOCUMENTS

CN    101107707 A    1/2008
CN    102130077 A    7/2011
(Continued)

OTHER PUBLICATIONS

International Search Report in counterpart International Application No. PCT/JP2015/074881, dated Nov. 17, 2015.
(Continued)

*Primary Examiner* — Davis D Hwu
(74) *Attorney, Agent, or Firm* — Baker Botts L.L.P.; Michael A. Sartori

(57) ABSTRACT

A heat radiating member includes: a composite portion composed of a composite material which contains particles of a satisfactorily thermally conductive material in a metal matrix; and a metal layer formed on at least one surface of the composite portion and composed of a metal. A method for producing a heat radiating member includes: a preparation step to prepare a composite material which contains particles of a satisfactorily thermally conductive material in a metal matrix; a powder arrangement step to dispose a
(Continued)

metal powder composed of metal particles on at least one surface of the composite material; and a heating step to heat the composite material and the metal powder, with the metal powder disposed on the composite material, to form a metal layer composed of a metal of the metal powder on a composite portion composed of the composite material.

18 Claims, 5 Drawing Sheets

(51) Int. Cl.
 *B22F 3/14* (2006.01)
 *B22F 3/16* (2006.01)
 *F28F 21/00* (2006.01)
 *F28F 21/08* (2006.01)
 *H01L 21/48* (2006.01)

(52) U.S. Cl.
 CPC ........ *F28F 21/089* (2013.01); *H01L 21/4871* (2013.01); *H01L 23/3732* (2013.01); *B22F 2301/255* (2013.01); *B22F 2304/10* (2013.01)

(58) Field of Classification Search
 CPC ..... H05K 7/20; B22F 3/14; B22F 3/16; B22F 2301/255; B22F 2304/10; C22C 1/05; F28F 21/00; F28F 21/089; H04M 1/0202
 USPC ........................................................ 165/185
 See application file for complete search history.

(56) References Cited

U.S. PATENT DOCUMENTS

| | | | |
|---|---|---|---|
| 5,981,085 A | 11/1999 | Ninomiya et al. | |
| 6,031,285 A | 2/2000 | Nishibayashi | |
| 6,139,979 A * | 10/2000 | Takaoka | B23K 35/262 |
| | | | 174/263 |
| 6,171,691 B1 | 1/2001 | Nishibayashi | |
| 6,255,376 B1 * | 7/2001 | Shikata | C08K 3/08 |
| | | | 524/404 |
| 6,270,848 B1 | 8/2001 | Nishibayashi | |
| 7,298,623 B1 * | 11/2007 | Kuczynski | H01L 23/473 |
| | | | 174/15.1 |
| 2008/0122052 A1 | 5/2008 | Fukui | |
| 2011/0203776 A1 * | 8/2011 | McAlister | F03G 7/05 |
| | | | 165/104.26 |
| 2013/0050953 A1 * | 2/2013 | Sano | H04M 1/0202 |
| | | | 361/720 |

FOREIGN PATENT DOCUMENTS

| | | |
|---|---|---|
| CN | 103966533 A | 8/2014 |
| EP | 1858078 A1 | 11/2007 |
| EP | 2332674 A1 | 6/2011 |
| EP | 2738802 A1 | 6/2014 |
| JP | H02-170452 A | 7/1990 |
| JP | H10-150124 A | 6/1998 |
| JP | H10-223812 A | 8/1998 |
| JP | H11-067991 A | 3/1999 |
| JP | 2001-284509 A | 10/2001 |
| JP | 2004-055577 A | 2/2004 |
| JP | 2004-197153 A | 7/2004 |
| JP | 2012-144767 A | 8/2012 |
| JP | 2014-001439 A | 1/2014 |

OTHER PUBLICATIONS

Extended European Search Report issued in counterpart European Application No. 15837587.3 dated Mar. 29, 2018.
Office Action in counterpart Japanese Patent Application No. 2016-546660, dated Jan. 25, 2019.
Office Action dated Mar. 20, 2019 in the counterpart CN Patent Application No. 201580047202.4.

* cited by examiner

HEAT RADIATING MEMBER AND METHOD FOR PRODUCING THE SAME

TECHNICAL FIELD

The present invention relates to the heat radiating member comprising a composite portion composed of a composite material and a metal layer composed of a metal, and its production method.

BACKGROUND ART

As semiconductor elements are increasingly developed to achieve higher integration, higher power and higher speed, they generate significant heat (or are significantly heated) in operation. Accordingly, the semiconductor element is mounted on a heat radiating member (referred to as a heat sink, a heat spreader, etc.) to dissipate the semiconductor element's heat externally via the heat radiating member.

The heat radiating member is required to have high thermal conductivity and in addition a small difference in coefficient of thermal expansion from the semiconductor element. Accordingly, as the heat radiating member, a composite material is utilized in which particles of a satisfactorily thermally conductive material such as diamond and SiC are dispersed in a metal matrix such as Ag, Cu and Al and thus compositied therewith. For example, as a composite material of diamond, Ag/diamond, Cu/diamond, Al/diamond, etc. are known, and as a composite material of SiC, Al/SiC etc. are known.

The above composite material is produced for example as follows: a powder of the satisfactorily thermally conductive material is introduced into a container or a die and subsequently thereon a powder, plate or the like of a metal that will serve as a metal matrix is disposed, and in that condition they are heated and the metal is thus molten and infiltrated between the particles of the satisfactorily thermally conductive material to produce the composite material. Patent documents 1-3 disclose a technique in which in a metal/diamond composite material an element of group 4 of the periodic table such as Ti is added to form a carbide of the element of group 4 of the periodic table on a surface of diamond particles to improve the diamond particle in wettability to enhance adhesion and bindability between the metal matrix and the diamond particle.

CITATION LIST

Patent Documents

Patent document 1: Japanese Patent Laying-Open No. 10-223812
Patent document 2: Japanese Patent Laying-Open No. 11-67991
Patent document 3: Japanese Patent Laying-Open No. 2004-197153

SUMMARY OF INVENTION

Technical Problem

Mounting of a semiconductor element to a heat radiating member is done by soldering, brazing etc. for example. The above composite material may have a surface with diamond particles, SiC particles etc. exposed. When such a nonmetallic inorganic material is exposed, the composite material's surface loses smoothness and in addition the nonmetallic inorganic material is inferior in wettability, and accordingly, soldering, brazing etc. thereto are difficult and bondability is impaired. Accordingly, there is a need for developing a technique allowing a semiconductor element to be easily mounted on a surface of a composite material to which the semiconductor element is bonded.

One of object of the present invention is to provide a heat radiating member allowing a semiconductor element to be bonded with high bondability to a surface of a composite portion composed of a composite material. Furthermore, another object of the present invention is to provide a method capable of producing the above heat radiating member.

Solution to Problem

A heat radiating member according to one manner of the present invention comprises: a composite portion composed of a composite material which contains particles of a satisfactorily thermally conductive material in a metal matrix; and a metal layer formed on at least one surface of the composite portion and composed of a metal.

A method of producing a heat radiating member according to one manner of the present invention comprises: a preparation step to prepare a composite material which contains particles of a satisfactorily thermally conductive material in a metal matrix; a powder arrangement step to dispose a metal powder composed of metal particles on at least one surface of the composite material; and a heating step to heat the composite material and the metal powder, with the metal powder disposed on the composite material, to form a metal layer composed of a metal of the metal powder on a composite portion composed of the composite material.

Advantageous Effects of Invention

The above heat radiating member having a metal layer formed on a surface of a composite portion composed of a composite material is satisfactory in solderability and brazability. The above method of producing the heat radiating member can produce the above heat radiating member.

DESCRIPTION OF EMBODIMENTS

Figure 1:
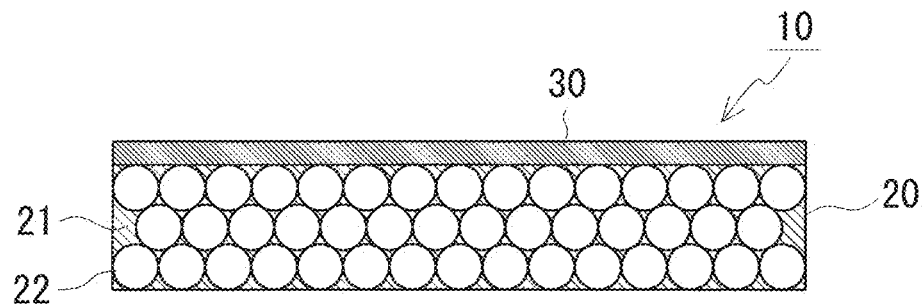
FIG. 1 is a schematic cross section showing an example of a heat radiating member according to an embodiment of the present invention.

Description of Embodiments of the Present Invention

The present inventors have considered diversely a technique used to form on a surface of a composite material a metal layer which is excellent in wettability with solder etc. and as a result have obtained the following findings: As one method of forming the metal layer, it is possible to plate a surface of a composite material with metal. When particles of a satisfactorily thermally conductive material composed of a nonmetallic inorganic material are exposed on a surface of a composite material, electroless plating will be an applicable plating method, however, with electroless plating, it is difficult to improve the surface in smoothness. As another method, it is possible to stick a metal foil on a surface of a composite material by hot pressing, however, on the surface of the composite material, projections and depressions are present through production and it is thus difficult to obtain sufficient adhesion. In that case, polishing the surface of the composite material to work it to be flat is also considered, however, the composite material contains diamond particles, SiC particles or other similar ceramic particles (particles of a satisfactorily thermally conductive material) and accordingly, the working per se is difficult, and in addition, the working generates heat, which may deform the composite material per se. In particular, when the composite material contains diamond particles, processing it is significantly difficult. Furthermore, in general, a metal foil is produced by rolling, and accordingly, it contains much working distortion through its production process. A metal which contains much working distortion easily causes recrystallization, and when the metal foil is stuck by hot pressing, the metal crystal grains composing the metal foil easily become coarse by recrystallization. When a metal layer formed of a metal foil, with metal crystal grains having a large crystal grain size, undergoes a severe heat cycle, the metal layer may crack. Furthermore, as another technique, it is possible to produce the composite material such that the amount of the metal matrix is increased to form a metal layer composed of a metal component of the metal matrix on a surface of the composite material. However, a metal layer formed by infiltration is a cast structure and accordingly, composed of metal crystal grains having a large crystal grain size, and in addition, easily contains casting defects such as shrinkage cavity, gas hole, etc. When the metal layer composed of metal crystal grains having a large crystal grain size undergoes a severe heat cycle the metal layer may crack and when the metal layer has a casting defect, it invites reduced heat radiation.

The present inventors have further investigated a technique to form a highly adhesive metal layer on a surface of a composite material and as a result have obtained the following findings. Since the composite material contains diamond particles, SiC particles or other similar ceramic particles and accordingly, these particles may provide a surface with projections and depressions (roughness). Other than this, in producing the composite material, when the composite material is produced such that the composite material has a surface in contact with an internal surface of a container (or mold), projections and depressions of the internal surface of the container (or mold) may be transferred to a surface of the composite material and projections and depressions may be formed on the surface of the composite material. Thus, as has been described above, when the metal layer is formed using a metal foil, a gap results between the metal layer and the composite material (or the composite portion), and their bonding area (or contact area) is reduced and as a result, it is difficult to obtain sufficient adhesion and the heat radiating member provides reduced heat radiation.

Accordingly, the present inventors have considered forming the metal layer using a metal powder rather than a metal foil. When a metal powder is used, the metal particles composing the metal powder flow and thus enter the projections and depressions of the surface of the composite material, and a gap is not easily formed between the metal layer and the composite material (or the composite portion). And in addition to their increased bonding area (or contact area) and hence their enhanced adhesion, its anchoring effect enhances the metal layer's adhesion strength. Herein, the metal particles composing the metal powder have a fine crystalline structure and also have crystal grains having a small grain size, and furthermore, have the crystal grains in a form close to a sphere. In contrast, a metal foil has much working distortion introduced therein by rolling, and easily causes recrystallization in hot pressing, and finally has coarse crystal grains formed therein. And the present inventors have obtained the finding that as a metal layer formed of a metal powder is derived from the metal powder, the metal layer has a crystalline structure where metal crystal grains have a small crystal grain size. Initially, embodiments of the present invention will be enumerated and described.

(1) A heat radiating member according to one manner of the present invention comprises: a composite portion composed of a composite material which contains particles of a satisfactorily thermally conductive material in a metal matrix; and a metal layer formed on at least one surface of the composite portion and composed of a metal.

The above heat radiating member having a metal layer formed on at least one surface of the composite portion is satisfactory in solderability and brazability. Thus the above heat radiating member allows a semiconductor element to be bonded to a surface thereof with high bondability. Furthermore, the above heat radiating member allows electroplating to be used to form a plating layer of metal on the metal layer and thus allows a surface to be improved in smoothness.

(2) As one form of the above heat radiating member, it is mentioned that the satisfactorily thermally conductive material is at least one type selected from diamond and SiC.

As the satisfactorily thermally conductive material, a nonmetallic inorganic material which has high thermal conductivity (e.g., 200 W/m·K or more), such as diamond and ceramics, is mentioned. Inter alia, diamond and SiC are preferable as they have high thermal conductivity. In particular, diamond has a significantly high thermal conductivity and is thus suitable.

(3) As one form of the above heat radiating member, it is mentioned that the metal matrix and the metal layer are composed of a metal which is at least one type selected from Ag, Cu, Al, Mg, and Au or an alloy thereof.

As a constituent metal of the metal matrix, a metal which has high thermal conductivity (e.g., 120 W/m·K or more, 200 W/m·K or more, in particular) is mentioned. Inter alia, Ag, Cu, Al, Mg, and Au, or an alloy thereof are preferable as they have high thermal conductivity. In particular, Ag has a high thermal conductivity, and is thus suitable. Furthermore, in general, metals such as Cu, Al, and Mg have a nature facilitating the metal to be oxidized, and easily form an oxide film on a surface at a stage as a raw material. Such an oxide film is per se not only an obstacle to heat conduction but also decreases wettability between the metal of the metal matrix and the nonmetallic inorganic material of the particles of the satisfactorily thermally conductive material in the infiltration step of the production process, and may be a cause of a casting defect inside the composite material (or composite portion). On the other hand, Ag has a special nature to discharge oxygen included therein when it is heated to 300° C. or more, and the above problem attributed to oxide film does not arise. Selecting Ag as a constituent metal of the metal matrix can suppress formation of oxide film, and thus increase the relative density of the composite material (or composite portion) and suppress reduction in thermally conduction (thermal conductivity) attributed to oxide film. This, in combination with Ag's high thermal conductivity, can improve the composite material's thermal conductivity significantly, and a heat radiating member which can provide more excellent heat radiation can be obtained.

As a metal which composes the metal layer, for example Ag, Cu, Al, Mg, Au, Ni, Zn, and Sn, or an alloy thereof can be used. Inter alia, Ag, Cu, Al, Mg, and Au, or an alloy thereof are preferable as they have high thermal conductivity (e.g., 120 W/m·K or more, 200 W/m·K or more, in particular). In particular, Ag has a high thermal conductivity, and is thus suitable. As has been described above, metals such as Cu, Al, and Mg are easily oxidized, and easily form an oxide film on a surface. When a metal powder, a metal foil or the like is used as a material to form the metal layer, an oxide film formed on a surface of the material is per se not only an obstacle to heat conduction but may also prevent bonding of metal particles composing the metal powder, bonding of the metal foil and the composite material (or composite portion), etc. On the other hand, Ag has a special nature to discharge oxygen included therein when it is heated to 300° C. or more, and the above problem attributed to oxide film does not arise. By selecting Ag as a constituent metal of the metal layer, reduction in thermal conduction (thermal conductivity) attributed to oxide film can be suppressed and the step of forming the metal layer (e.g., a hot pressing step) can be implemented at a relatively low temperature with a relatively low pressure in a relatively short period of time, and excellent productivity can be achieved.

(4) As one form of the above heat radiating member, it is mentioned that the composite portion has a thermal conductivity of 120 W/m·K or more.

The composite portion having a thermal conductivity of 120 W/m·K or more ensures that the heat radiating member has sufficient thermal conductivity and hence provides excellent heat radiation. The higher the composite portion's thermal conductivity is, the more preferable, and for example, 180 W/m·K or more, 200 W/m·K or more, 300 W/m·K or more, 400 W/m·K or more are more preferable. Furthermore, 500 W/m·K or more, 550 W/m·K or more, 600 W/m·K or more are still more preferable.

(5) As one form of the above heat radiating member, it is mentioned that the metal layer is composed of a metal which is identical to a metal composing the metal matrix or an alloy containing 60 mass % or more of a metal identical to that of a major component composing the metal matrix.

The metal layer composed of a metal identical in type to a metal of a major component of the metal matrix, more specifically, a metal which is identical to a metal composing the metal matrix or an alloy containing 60 mass % or more of a metal identical to a metal of a major component composing the metal matrix, allows corrosion between dissimilar metals to be suppressed.

(6) As one form of the above heat radiating member, it is mentioned that the metal layer is composed of a metal having crystal grains having an average crystal grain size of 30 µm or less and that the metal layer has a thickness of 10 µm or more and 500 µm or less.

According to the above heat radiating member, the metal layer is composed of a metal having crystal grains having an average crystal grain size of 30 µm or less. Such a metal layer's crystalline structure is obtained by forming the metal layer using a metal powder, and thus allows close adhesion between the composite portion and the metal layer and hence sufficient adhesion strength. And according to the above heat radiating member, the metal layer closely adheres to the composite portion, and accordingly, they have a large bonding area (or contact area) and enhanced heat radiation can be contemplated. Furthermore, the metal crystal grain has an average crystal grain size of 30 µm or less, and even in a serve heat cycle, cracking in the metal layer can be suppressed. Thus, the above heat radiating member allows satisfactory adhesion between the composite portion and the metal layer and thus has an excellent heat cycle endurance.

Furthermore, according to the above heat radiating member, the metal layer that has a thickness of 10 µm or more ensures a sufficient thickness for soldering, brazing, etc., and hence solderability and brazability and also helps to planarize a surface of the heat radiating member (or the metal layer). On the other hand, when the metal layer is excessively thick, a thermal stress attributed to a thermal expansion difference caused between the composite portion and the metal layer and/or between a semiconductor element bonded to the metal layer and the metal layer is increased, and the metal layer, the semiconductor element, etc. may peel off, be damaged or the like. Furthermore, in a system in which the thermal conductivity of a simple substance of a metal composing the metal layer is lower than the thermal conductivity of satisfactorily thermally conductive material particles (or a nonmetallic inorganic material) contained in the composite material (or composite portion), the thicker the metal layer is, the lower the heat radiating member's total thermal conductivity may be. As an example of such a system, a case where the composite portion is composed of a composite material which is for example Ag/diamond, Al/SiC, etc. is mentioned. The metal layer having a thickness of 500 µm or less can suppress peeling, damage etc. thereof, and can suppress the heat radiating member's total thermal conductivity reduction even in a system in which the thermal conductivity of the nonmetallic inorganic material is higher.

(7) As one form of the above heat radiating member, it is mentioned that an adhesion strength of the metal layer for the composite portion is 30 N/cm or more.

As the adhesion strength of the metal layer is 30 N/cm or more, practically sufficient adhesion strength is provided and peeling of the metal layer off the composite portion can be suppressed.

(8) As one form of the above heat radiating member, it is mentioned that the metal layer has a surface with an arithmetic mean roughness Ra of 1 µm or less.

The metal layer having a surface with an arithmetic mean roughness Ra of 1 µm or less can have a flat surface and allows a semiconductor element to closely adhere thereto and an increased cooling effect can be achieved.

(9) As one form of the above heat radiating member, it is mentioned that the composite portion and the metal layer have a bonding interface having an arithmetic mean roughness Ra more than 1 µm.

As the composite portion and the metal layer have a bonding interface having an arithmetic mean roughness Ra more than 1 µm, the composite portion and the metal layer can have an increased contact area and the metal layer can also closely adhere to the composite portion more strongly by an anchoring effect.

(10) As one form of the above heat radiating member, it is mentioned that, in a region in which the metal layer is formed, a ratio in area of a non-bonded portion of the composite portion and the metal layer relative to an area in which the metal layer is formed is less than 0.5%.

An area ratio of a non-bonded portion of the composite portion and the metal layer relative to an area in which the metal layer is formed (hereinafter also referred to as a "non-bonded area ratio"), that is less than 0.5%, allows sufficient adhesion between the composite portion and the metal layer and hence enhanced adhesion therebetween, and hence more increased heat radiation.

(11) As one form of the above heat radiating member, it is mentioned that a thermal conductivity degradation rate after a heat cycle test of −40° C. and 200° C. is 5% or less.

The thermal conductivity degradation rate after a heat cycle test that is 5% or less allows reduction in thermal conductivity to be suppressed even in a serve heat cycle. Thus, the above heat radiating member can maintain high thermal conductivity and thus has an excellent heat cycle endurance.

(12) A method of producing a heat radiating member according to one manner of the present invention comprises: a preparation step to prepare a composite material which contains particles of a satisfactorily thermally conductive material in a metal matrix; a powder arrangement step to dispose a metal powder composed of metal particles on at least one surface of the composite material; and a heating step to heat the metal powder and the composite material, with the metal powder disposed on the composite material, to form a metal layer composed of a metal of the metal powder on a composite portion composed of the composite material.

According to the above production method, a metal layer formed of a metal powder can be formed on at least one surface of the composite material, and a heat radiating member comprising a composite portion composed of the composite material and the metal layer composed of a metal can be produced. According to the above production method, a metal powder is used as a material used to form the metal layer, and the metal particles composing the metal powder enter projections and depressions of a surface of the composite material, and a gap is not easily formed between the metal layer and the composite material (or the composite portion). And in addition to their increased bonding area (or contact area) and hence their enhanced adhesion, its anchoring effect enhances the metal layer's adhesion strength. The metal particles composing the metal powder have a fine crystalline structure and also have crystal grains having a small grain size. For example, the metal particle has metal crystal grains having an average crystal grain size of 30 μm or less. The metal layer formed in the above production method is derived from a metal powder, and the metal layer thus has a crystalline structure where metal crystal grains have a small crystal grain size. Specifically, the metal layer is composed of a metal having crystal grains having an average crystal grain size of 30 μm or less. The above method of producing the heat radiating member can thus produce the heat radiating member according to one manner of the present invention as described above.

(13) As one form of the method of producing a heat radiating member, it is mentioned that in the heating step, the composite material and the metal powder are hot-pressed.

This method is a form which forms the metal layer by hot pressing. By performing hot pressing, the metal powder can be compressed on a surface of the composite material to bury metal particles in projections and depressions of the surface of the composite material, so that the composite material (or composite portion) and the metal layer closely adhere to each other, and the metal layer can thus be formed with high adhesion strength. Furthermore, the metal layer can have a flat surface.

(14) As one form of the method of producing a heat radiating member, it is mentioned that in the above form which performs hot pressing in the heating step, the hot pressing is done at 300° C. or more with a pressure of 98 MPa or more applied.

(15) As one form of the method of producing a heat radiating member, it is mentioned that in the above form which performs hot pressing in the heating step, the hot pressing is done at 400° C. or more with a pressure of 19.6 MPa or more applied.

The present inventors have found as a result of a consideration that hot pressing performed at higher temperature allows a lower pressure to be applied to form the metal layer and hot pressing performed with higher pressure applied allows a lower temperature to be applied to form the metal layer. When the hot pressing is performed at a temperature of 300° C. or higher with a pressure of 98 MPa or more or when the hot pressing is performed at a temperature of 400° C. or higher with a pressure of 19.6 MPa or more, it is easy to form a metal layer which is dense and provides large adhesion strength.

(16) As one form of the method of producing a heat radiating member, it is mentioned that in the above form which performs hot pressing in the heating step, before the heating step, a powder compacting step is comprised in which, in a state where the metal powder is placed on the composite material, cold pressing is performed to preform the metal powder.

Preforming the metal powder can enhance productivity. Hot pressing is performed such that the composite material with the metal powder placed thereon is disposed in a die, and in doing so, preheating the die of the hot pressing allows a period of time to be reduced that is required to heat the die to a temperature necessary for the hot pressing. However, introducing the metal powder into the die in a state of high temperature is difficult and thus performed inefficiently. Preforming the metal powder allows the composite material with the metal powder placed thereon to be easily disposed in the preheated die and thus allows improved operability.

(17) As one form of the method of producing a heat radiating member, it is mentioned that before the heating step, a powder compacting step is comprised in which, in a state where the metal powder is placed on the composite material, cold pressing is performed to preform the metal powder, and in the heating step, the composite material and the metal powder are sintered.

This method is a form which forms the metal layer by sintering. Cold pressing before sintering can bury metal particles at projections and depressions of a surface of the composite material, and thus enhance adhesion between the composite portion and the metal powder. By sintering in that condition, the composite material (or composite portion) and the metal layer closely adhere to each other, and the metal layer can thus be formed with high adhesion strength. Furthermore, by preforming the metal powder by cold pressing, a metal layer with a flat surface can be formed.

(18) As one form of the method of producing a heat radiating member, it is mentioned that in the above form which performs sintering in the heating step, the cold pressing before the sintering is done with a compacting pressure of 196 MPa or more applied and the sintering is done at a temperature of 600° C. or more.

(19) As one form of the method of producing a heat radiating member, it is mentioned that in the above form which performs sintering in the heating step, the cold pressing before the sintering is done with a compacting pressure of 9.8 MPa or more applied and the sintering is done at a temperature of 700° C. or more.

The present inventors have found as a result of a consideration that a higher sintering temperature allows the cold pressing to be done with a lower compacting pressure applied to form the metal layer, and in contrast, cold pressing performed with higher compacting pressure allows a lower sintering temperature to be applied to form the metal layer. The cold pressing with a compacting pressure of 196 MPa or more and a sintering temperature of 600° C. or more, or the cold pressing with a compacting pressure of 9.8 MPa or more and a sintering temperature of 700° C. or more, help to form a metal layer which is dense and provides large adhesion strength.

(20) As one form of the method of producing a heat radiating member, it is mentioned that the metal powder is composed of a metal of Ag.

As has been described above, Ag has a special nature to discharge oxygen included therein when it is heated to 300° C. or more, and when it is heated in forming the metal layer, the metal powder (or metal particles) has oxygen removed therefrom. Accordingly, when the metal powder is heated to form the metal layer, formation of oxide film on a surface of the metal particle can be suppressed, and large adhesion is provided between the composite portion and the metal layer and it is easy to form the metal layer to have metal particles bonded via a metallic bond. Thus a metal powder of a metal of Ag, as compared with other metals such as Cu and Al, more easily forms a metal layer which is dense and provides large adhesion strength even at low temperature.

(21) As one form of the method of producing a heat radiating member, it is mentioned that the metal powder is composed of metal particles having an average particle size of 1 µm or more and 40 µm or less.

The metal particles having an average particle size of 1 µm or more and 40 µm or less easily enter projections and depressions of a surface of the composite material and can thus enhance adhesion between the composite portion and the metal layer. Preferably, the metal particle has an average particle size of 20 µm or less.

DETAILED DESCRIPTION OF EMBODIMENTS OF THE PRESENT INVENTION

A specific example of a heat radiating member and its production method according to an embodiment of the present invention will now be described with reference to the drawings. Note that the present invention is not limited to these examples, and is intended to include any modifications within the meaning and scope indicated by and equivalent to the terms of the claims.

<Heat Radiating Member>

A heat radiating member 10, as shown in FIG. 1, comprises a composite portion 20 composed of a composite material which contains particles 22 of a satisfactorily thermally conductive material in a metal matrix 21; and a metal layer 30 formed on at least one surface of composite portion 20 and composed of a metal. Heat radiating member 10 shown in FIG. 1 is in the form of a flat plate.

[Composite Portion]

Composite portion 20 is a portion composed of a composite material which contains particles 22 of the satisfactorily thermally conductive material in metal matrix 21. As composite portion 20, a composite material can be used for example in which metal matrix 21 is of a metal such as Ag, Cu and Al, and particles 22 of the satisfactorily thermally conductive material are particles of diamond, SiC (silicon carbide), etc. Specifically mentioned are metal/diamond composite materials such as Ag/diamond, Cu/diamond and Al/diamond, metal/SiC composite materials such as Ag/SiC, Cu/SiC and Al/SiC, etc. The composite material can be a known composite material and can be produced in a known production method such as infiltration and sintering.

(Particles of Satisfactorily Thermally Conductive Material)

Particles 22 of a satisfactorily thermally conductive material are composed of a nonmetallic inorganic material having a high thermal conductivity (e.g., 200 W/m·K or more) such as diamond and ceramics. As particles 22 of the satisfactorily thermally conductive material, diamond particles and SiC particles are preferable, for example. In particular, diamond has a significantly high thermal conductivity and is thus suitable. It is mentioned that satisfactorily thermally conductive material particles 22 have an average particle size of 1 µm or more and 300 µm or less, for example, and a volume ratio of satisfactorily thermally conductive material particles 22 in composite portion (or composite material) 20 is 30 volume % or more and 90 volume % or less, for example. The average particle size of satisfactorily thermally conductive material particles 22 is preferably 10 µm or more and 100 µm or less, and 20 µm or more and 60 µm or less, for example.

(Metal Matrix)

Metal matrix 21 is composed of a metal which has a high thermal conductivity (e.g., 120 W/m·K or more, 200 W/m·K or more, in particular). As a metal which composes metal matrix 21, for example, Ag, Cu, Al, Mg and Au or an alloy thereof are preferable. In particular, Ag has a high thermal conductivity, and is thus suitable. Furthermore, Ag has a special nature to discharge oxygen included therein when it is heated to 300° C. or more, and the above problem associated with formation of oxide film can be avoided. This can suppress reduction in adhesion and bondability of satisfactorily thermally conductive material particles 22 and metal matrix 21 and increase the composite material's relative density. Thus, by selecting Ag as a constituent metal of metal matrix 21, in combination with Ag's high thermal conductivity, the composite material's thermal conductivity is significantly enhanced, and heat radiating member 10 which can provide more excellent heat radiation can be obtained.

(Thermal Conductivity)

Composite portion (composite material) 20 preferably has a thermal conductivity of 120 W/m·K or more. Composite portion 20 having a thermal conductivity of 120 W/m·K or more ensures that heat radiating member 10 has sufficient thermal conductivity and hence provides excellent heat radiation. Composite portion 20 more preferably has a thermal conductivity for example of 180 W/m·K or more, 200 W/m·K or more, 300 W/m·K or more, 400 W/m·K, and still more preferably 500 W/m·K or more, 550 W/m·K or more, 600 W/m·K or more.

(Shape and Size)

Composite portion (or composite material) 20 may be shaped and sized, as appropriate, depending on how it is used. Composite portion 20 is shaped representatively in a flat plate, a block, or a rod. Other than this, it is also possible to provide it in a three-dimensional form having projections and depressions for example. Composite portion 20 is sized for example to be 50 mm or more in width, 50 mm or more in length, and 0.5 mm or more in thickness. Composite portion (or composite material) 20 shown in FIG. 1 is in the form of a flat plate.

[Metal Layer]

Metal layer 30 is a portion formed on at least one surface of composite portion 20 and composed of a metal. This metal layer 30 is formed of a metal powder, as will be described later. In FIG. 1, metal layer 30 is formed throughout an upper surface of composite portion 20 (i.e., one surface thereof in the direction of the thickness). Metal layer 30 may be formed on both an upper surface and a lower surface of composite portion 20 or a portion of the upper or lower surface.

As a metal which composes metal layer 30, for example Ag, Cu, Al, Mg, Au, Ni, Zn, and Sn, or an alloy thereof can be used. Inter alia, Ag, Cu, Al, Mg and Au or an alloy thereof are preferable as they have high thermal conductivity (e.g., 120 W/m·K or more, 200 W/m·K or more, in particular). In particular, Ag has a high thermal conductivity, and is thus suitable. Furthermore, Ag has a special nature to discharge oxygen included therein when it is heated to 300° C. or more, and by heating it in forming metal layer 30, oxygen in metal layer 30 can be reduced. Reducing oxygen in metal layer 30 can suppress formation of oxide film on a bonding interface of composite portion 20 and metal layer 30, the surfaces of the metal particles composing metal layer 30, etc. By selecting Ag as a constituent metal of metal layer 30, formation of oxide film can be suppressed, strength of adhesion with composite portion 20 is increased, and it is easy to form metal layer 30 having Ag particles bonded via a metallic bond. Furthermore, by composing metal layer 30 and metal matrix 21 of the same type of metal, corrosion between dissimilar metals can be suppressed. From the viewpoint of effectively suppressing corrosion between dissimilar metals, the metal layer is preferably composed of a metal which is identical to a metal of the metal matrix or an alloy containing 60 mass % or more of a metal of a major component of the metal matrix.

(Crystalline Structure)

Metal layer 30 is derived from a metal powder, and the metal layer thus has metal crystal grains having a small crystal grain size. Specifically, metal layer 30 is composed of metal crystal grains having an average crystal grain size of 30 µm or less. With the metal crystal grain having an average crystal grain size of 30 µm or less, even in a serve heat cycle, cracking in metal layer 30 can be suppressed. The average crystal grain size of the metal crystal grain is preferably 20 µm or less and 10 µm or less for example.

The metal crystal grain's average crystal grain size is measured by observing with a scanning electron microscope (SEM) a crystalline structure of heat radiating member 10 (or metal layer 30) in a longitudinal cross section cut in the direction of the thickness thereof. The metal crystal grain's average crystal grain size is obtained by calculating the diameters of individual metal crystal grains equivalent to a circle of an equal area from the cross-sectional observed image and averaging the calculated diameters. Herein, at least 50 or more crystal grains are measured.

(Thickness)

Metal layer 30 has a thickness of 10 µm or more and 500 µm or less. Metal layer 30 that has a thickness of 10 µm or more ensures a sufficient thickness for soldering, brazing, etc., and hence solderability and brazability and also helps to planarize a surface of heat radiating member 10 (or metal layer 30). Furthermore, when further forming a plating layer of metal on the metal layer, metal layer 30, having a thickness of 10 µm or more, can sufficiently function as an underlying layer for plating. On the other hand, when metal layer 30 is excessively thick, a thermal stress attributed to a thermal expansion difference caused between composite portion 20 and metal layer 30 and/or between a semiconductor element (not shown) bonded to metal layer 30 and metal layer 30 is increased, and metal layer 30, the semiconductor element, etc. may be warped, peeled, damaged or the like. Metal layer 30 having a thickness of 500 µm or less can suppress peeling, damage, etc. thereof. Furthermore, with metal layer 30 having a thickness of 500 µm or less, even in a case where the thermal conductivity of a metal which composes metal layer 30 is lower than the thermal conductivity of composite portion 20, reduction in total thermal conductivity of heat radiating member 10 can also be suppressed. The thickness of metal layer 30 is preferably 20 µm or more and 300 µm or less, and 40 µm or more and 200 µm or less for example.

The thickness of metal layer 30 can be obtained from an SEM image obtained by observing a longitudinal cross section of heat radiating member 10 with an SEM. Specifically, from any point Pn on a surface of metal layer 30 in the observed cross sectional image toward composite portion 20 in the direction of the thickness, a straight line perpendicular to the surface of metal layer 30 is drawn, and a point at which this straight line first crosses satisfactorily thermally conductive material particle 22 in composite portion 20 is represented as Qn. Let the length of this line segment PnQn be the thickness of metal layer 30 at point Pn. And the position of Pn is changed and the length of line segment PnQn is measured at at least ten locations, and an average value thereof is regarded as a thickness of metal layer 30.

(Adhesion Strength)

An adhesion strength of metal layer 30 for composite portion 20 is preferably 30 N/cm or more. When metal layer 30 presents an adhesion strength of 30 N/cm or more, it is larger than a general solder's bonding strength, and has a practically sufficiently adhesion strength and can thus suppress peeling of metal layer 30 off the composite portion 20. The adhesion strength of metal layer 30 is preferably 50 N/cm or more for example.

The adhesion strength of metal layer 30 is measured as follows: Initially, an about 5 mm wide tape of copper is prepared, and this tape's one end is soldered to a surface of metal layer 30 of heat radiating member 10. In doing so, allowing the tape to remain unsoldered by about 50 mm helps to perform a subsequent operation. Subsequently, heat radiating member 10 is fixed to a jig, and in that condition, the other end of the tape is pulled in a direction of 90 degrees (or perpendicularly) relative to the surface of heat radiating member 10 (or metal layer 30) to peel off metal layer 30. The length to be peeled off is 7 mm or more. And this test is done 5 times or more, and an average value of a tensile force (or stress) required for the peeling is regarded as peeling strength, and let this value be adhesion strength. This measurement method cannot measure peeling strength (or adhesion strength) equal to or greater than bonding strength of solder, and has an upper limit of about 30 N/cm for measured values, however, this value is a sufficient value for evaluating and determining practical adhesion strength.

(Surface Roughness)

Metal layer 30 preferably has a surface with an arithmetic mean roughness Ra of 1 µm or less. Metal layer 30 having a surface with an arithmetic mean roughness (Ra) of 1 µm or less can have a flat surface and allows a semiconductor element to closely adhere thereto and an increased cooling effect can be achieved. Herein arithmetic mean roughness Ra indicates arithmetic mean roughness Ra defined by "JIS B0601:2001". Surface roughness (Ra) of metal layer 30 is preferably 0.8 μm or less for example.

(Interface Roughness)

Composite portion 20 and metal layer 30 preferably have a bonding interface having an arithmetic mean roughness Ra more than 1 μm. Composite portion 20 and metal layer 30 having an interface roughness more than 1 μm can have an increased contact area and metal layer 30 can also closely adhere to composite portion 20 more strongly by an anchoring effect. The interface roughness (Ra) of composite portion 20 and metal layer 30 is preferably 3 μm or more, 5 μm or more in particular, for example. The interface roughness of composite portion 20 and metal layer 30 is substantially the same as surface roughness (Ra) of composite portion (or composite material) 20.

The interface roughness of composite portion 20 and metal layer 30 is measured as follows: a longitudinal cross section of heat radiating member 10 is observed with an SEM, and from the observed, cross-sectional image, a contour curve of the bonding interface of composite portion 20 and metal layer 30 is extracted and that contour curve's arithmetic average roughness Ra is measured to measure the interface roughness of composite portion 20 and metal layer 30.

(Non-Bonded Area Ratio)

Preferably, in a region in which metal layer 30 is formed, a ratio in area of a non-bonded portion of composite portion 20 and metal layer 30 relative to an area in which metal layer 30 is formed is less than 0.5%. Composite portion 20 and metal layer 30 having a non-bonded area ratio less than 0.5% sufficiently adhere to each other and hence have enhanced adhesion therebetween, and increased heat radiation is achieved. The non-bonded area ratio of composite portion 20 and metal layer 30 is preferably 0.1% or less, 0.05% or less, ultimately 0%.

The non-bonded area ratio of composite portion 20 and metal layer 30 is measured as follows: Heat radiating member 10 is scanned from the side of metal layer 30 with an ultrasonic reflectscope. And a reflected image at an interface of composite portion 20 and metal layer 30 is obtained, and from the obtained reflected image, in a region in which metal layer 30 is formed, an area ratio of a non-bonded portion of composite portion 20 and metal layer 30 relative to an area in which metal layer 30 is formed, is calculated.

(Thermal Conductivity Degradation Rate after Heat Cycle Test)

A thermal conductivity degradation rate after a heat cycle test of −40° C. and 200° C. is preferably 5% or less. The thermal conductivity degradation rate after a heat cycle test that is 5% or less allows reduction in thermal conductivity to be suppressed even in a serve heat cycle, and high thermal conductivity can be maintained. The smaller the thermal conductivity degradation rate after the heat cycle test is, the more preferable, and for example, being less than 5%, and furthermore, 4% or less, 3% or less, 2% or less, and 1% or less is preferable.

The thermal conductivity degradation rate after the heat cycle test is obtained as follows: Initially, a thermal conductivity ($\lambda_1$) of heat radiating member 10 before the heat cycle test is measured. The thermal conductivity is measured for example using a laser flash type thermal conductivity measuring device. Subsequently, heat radiating member 10 is subjected to a heat cycle test in which a lower temperature side of −40° C. and a higher temperature side of 200° C. are set as one cycle. The heat cycle test performs the heat cycle 1000 times or more. A thermal conductivity ($\lambda_2$) of heat radiating member 10 after the heat cycle test is measured. And from thermal conductivities $\lambda_1$ and $\lambda_2$ before and after the heat cycle test, a thermal conductivity degradation rate (%) after the heat cycle test is calculated by the following expression:

$$\text{Degradation rate (\%)} = [(\lambda_1 - \lambda_2)/\lambda_1] \times 100.$$

<Method of Producing the Heat Radiating Member>

Heat radiating member 10 can be produced in the following production method. The method of producing the heat radiating member comprises a preparation step, a powder arrangement step, and a heating step. Hereinafter, each step will be described specifically.

[Preparation Step]

Figure 2:
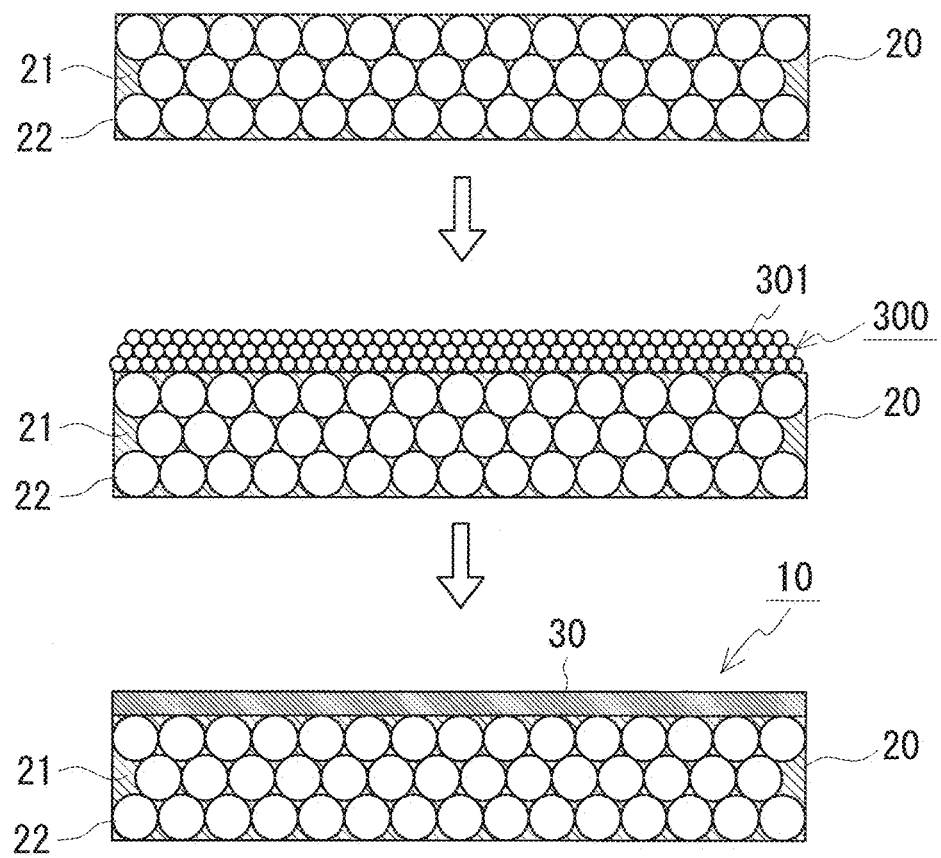
FIG. 2 schematically illustrates a process for producing a heat radiating member according to an embodiment of the present invention.

In the preparation step, composite material 20 containing particles 22 of a satisfactorily thermally conductive material in metal matrix 21 is prepared (see FIG. 2, uppermost figure). As has been described above, the composite material can be a known composite material and can be produced in a known production method such as infiltration and sintering.

An example of the method of producing the composite material will be described with reference to FIG. 3 and FIG. 4. A mold 100 shown in FIG. 3 comprises a body 110 having an upper side and a front side opened, and a lid 120 which closes the opening of the front side of body 110. Body 110 has a bottom 111, a rear wall 112, and a right wall 113 and a left wall 114 facing each other. Lid 120 is disposed to face rear wall 112 of body 110 and serves as a front wall. And mold 100 is configured by combining body 110 and lid 120 and a space in the form of a flat plate is formed which is surrounded by bottom 111, rear wall 112, a right wall 113, a left wall 114, and lid (or front wall) 120.

Figure 4:
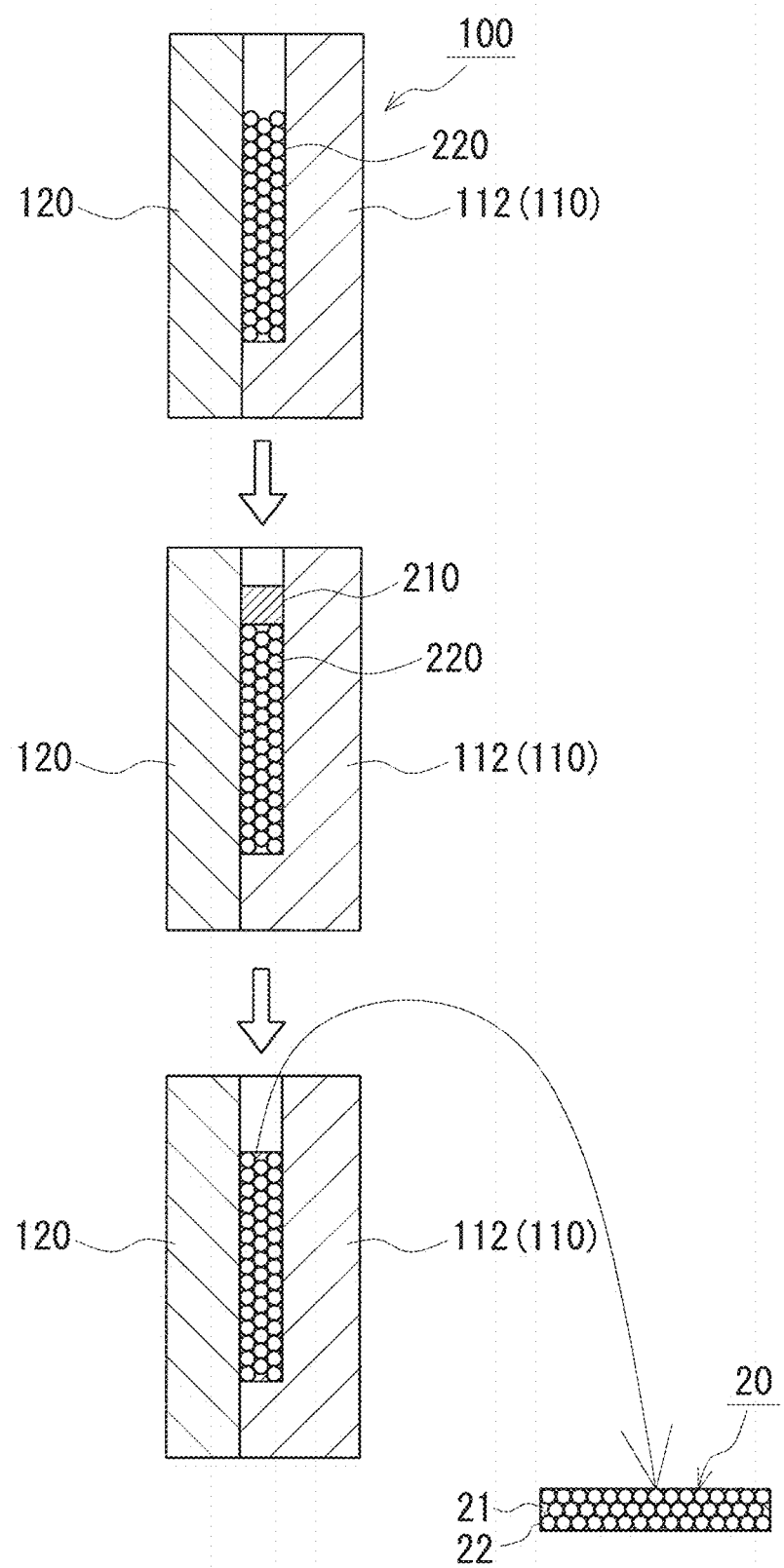
FIG. 4 schematically illustrates one example of a process for producing the composite material.

A particulate material 220 of a satisfactorily thermally conductive material is introduced into mold 100 (see FIG. 4, uppermost figure). Particulate material 220 of the satisfactorily thermally conductive material is a material which composes particles of the satisfactorily thermally conductive material of the composite material and can for example be a powder of the satisfactorily thermally conductive material. For example when the satisfactorily thermally conductive material is diamond or SiC, the powder of the satisfactorily thermally conductive material may be mixed with an additive agent of a powder of an element of group 4 of the periodic table (Ti, Zr, Hf) in order to improve the diamond particles, SiC particles etc. in wettability.

Subsequently, on particulate material 220 of the satisfactorily thermally conductive material, a metal material 210 for a matrix is disposed (see FIG. 4, middle figure). Metal material 210 for the matrix is a material which composes the metal matrix of the composite material, and can for example be a powder, plate material or massive material of a metal. For example when the satisfactorily thermally conductive material of particulate material 220 of the satisfactorily thermally conductive material is diamond or SiC etc., metal material 210 for the matrix may be mixed with an additive agent of an element of group 4 of the periodic table (Ti, Zr, Hf) in order to improve the diamond particles, the SiC particles etc. in wettability.

Subsequently, in a state in which particulate material 220 of the satisfactorily thermally conductive material and metal material 210 for the matrix are in contact with each other, mold 100 is heated to melt metal material 210 for the matrix to infiltrate a metal between the particles of particulate material 220 of the satisfactorily thermally conductive material (see FIG. 4, lowermost figure). Subsequently, mold 100 is cooled to obtain composite material 20 which contains the particles of the satisfactorily thermally conductive material in the metal matrix. In mold 100 shown in FIG. 3, composite material 20 to be produced will have an upper surface or a lower surface (one or the other surface in the direction of the thickness) in contact with front wall 120 or rear wall 112 of mold 100.

Other than this, the particulate material of the satisfactorily thermally conductive material can be such that a powder of the satisfactorily thermally conductive material is compacted to couple particles of the satisfactorily thermally conductive material together to provide a porous body of a skeleton structure. The particulate material of the satisfactorily thermally conductive material that is a porous body of the satisfactorily thermally conductive material in a skeleton structure can be disposed in mold 100 such that the porous body of the satisfactorily thermally conductive material stands for itself. Accordingly, by disposing the porous body of the satisfactorily thermally conductive material with a gap between the porous body and front wall 120 or rear wall 112 of mold 100, it is also possible to form a metal layer composed of a metal component of the metal matrix on the upper or lower surface of composite material 20. The porous body of the satisfactorily thermally conductive material may be a sintered material which is a powder of the satisfactorily thermally conductive material which is sintered, or a green compact which is a powder of the satisfactorily thermally conductive material which is compressed and thus compacted. The sintering may be done by directly sintering the powder of the satisfactorily thermally conductive material, or indirectly sintering it for example with a sintering additive such as a fine powder of alumina ($Al_2O_3$) mixed together. When the porous body of the satisfactorily thermally conductive material is disposed in mold 100, a powder of a metal to be metal material 210 for the matrix may previously be introduced into a gap formed between the porous body and front wall 120 or rear wall 112 of mold 100. The powder of the metal introduced in the gap can suppress movement of the porous body in mold 100 in handling mold 100, and can thus suppress a change of the gap in size. Furthermore, when a substrate for example such as aluminum nitride (AlN) and $Al_2O_3$ is previously disposed in this gap, the substrate can be integrated in the infiltration step in producing the composite material.

[Powder Arrangement Step]

In the powder arrangement step, a metal powder 300 composed of metal particles 301 is placed on at least one surface of composite material 20 (see FIG. 2, middle figure). In FIG. 2, metal powder 300 is placed throughout an upper surface of composite material 20. Metal powder 300 is a material which forms metal layer 30 of heat radiating member 10 (see FIG. 2, lowermost figure), and the metal of metal powder 300 composes metal layer 30.

(Metal Powder)

Metal powder 300 can be powders produced for example in an atomization method (a water atomization method and a gas atomization method), electrolysis, etc. Metal powder 300 is composed of a large number of metal particles 301, and metal particle 301 has a fine crystalline structure and also has crystal grains having a small grain size, and furthermore, has the crystal grains in a form close to a sphere. Specifically, metal particle 301 has metal crystal grains having an average crystal grain size of 30 μm or less.

(Average Particle Size of Metal Particle)

Preferably, metal powder 300 is composed of metal particles 301 having an average particle size of 1 μm or more and 40 μm or less. The metal particles having an average particle size of 1 μm or more and 40 μm or less easily enter projections and depressions of a surface of the composite material. Preferably, metal particle 301 has an average particle size of 40 μm or less. The average particle size is a particle diameter such that a cumulative volume in a volumetric particle size distribution measured with a laser diffraction type particle size distribution measurement device is 50% (D50).

[Heating Step]

In the heating step, in a state where metal powder 300 is placed on composite material 20, composite material 20 and metal powder 300 are heated. By this, metal layer 30 composed of a metal of a metal powder is formed on composite portion 20 composed of the composite material (see FIG. 2, lowermost figure). In the heating step, hot pressing composite material 20 and metal powder 30 or sintering composite material 20 and metal powder 30 is mentioned.

(Hot Pressing)

The hot pressing is done such that composite material 20 and metal powder 300 are heated while metal powder 300 is pressed against a surface of composite material 20. By the hot pressing, metal particles 301 composing metal powder 300 flow and easily enter projections and depressions of a surface of composite material 20, and composite material (or composite portion) 20 and metal layer 30 closely adhere to each other, and metal layer 30 with high adhesion strength can thus be formed. Furthermore, metal layer 30 with a flat surface can be formed. The hot pressing is performed preferably at a temperature of 300° C. or more with a pressure of 98 MPa (1000 kgf/cm$^2$) or more, or a temperature of 400° C. or more with a pressure of 19.6 MPa (200 kgf/cm$^2$) or more, and metal layer 30 which is dense and provides large adhesion strength can thus be formed. Hot pressing done at a higher temperature with a larger pressure helps to form metal layer 30 which is dense and provides excellent adhesion. The upper limit in temperature of the hot pressing is set to the melting point or less of metal powder 300. In order to increase the temperature and the pressure, the hot pressing is required to be performed in an apparatus having a die having a heat-resistant structure and a pressure-resistant structure, which invites an increased facilities cost, and accordingly, the hot pressing's temperature is preferably 900° C. or less and the hot pressing's pressure is preferably 980 MPa (10000 kgf/cm$^2$) or less.

It is mentioned that the hot pressing's pressing time is for example 0.5 minute or more and 60 minutes or less. Hot pressing done at higher temperature with higher pressure has a tendency allowing the pressing time to be reduced. Furthermore, while the hot pressing may be done in an atmosphere of the atmospheric air, in view of preventing oxidation of composite material 20 and metal powder 300, an inert gas (e.g., Ar gas) atmosphere and a vacuum atmosphere are preferable. The atmospheric air allows simplified facilities and excellent productivity. Furthermore, when Ag is adopted as a constituent metal of the metal matrix and the metal layer, they are not easily oxidized and even when the hot pressing is implemented in the atmospheric air, a problem by oxidation is not easily caused.

When the hot pressing is performed, then before the heating step is performed, there may be included a powder compacting step to perform cold pressing with metal powder 300 placed on composite material 20 to thus preform metal powder 300. By preforming metal powder 300, composite material 20 with metal powder 300 thereon can be easily disposed in the die preheated, and enhanced operability can be achieved. It is mentioned that the cold pressing's compacting pressure is set to 9.8 MPa (100 kgf/cm$^2$) or more and 490 MPa (5000 kgf/cm$^2$) or less for example.

(Sintering)

When sintering, before the heating step, a powder compacting step is comprised in which, in a state where metal powder 300 is placed on composite material 20, metal powder 300 is preformed, and the sintering is performed in the subsequent, heating step. By performing cold pressing before sintering, metal particles 301 composing metal powder 300 flow and easily enter projections and depressions of a surface of composite material 20, and thus enhance adhesion between composite material 20 and metal powder 300. By sintering in that condition, composite material (or composite portion) 20 and metal layer 30 closely adhere to each other, and metal layer 30 with high adhesion strength can thus be formed. Sintering can be done without compressing metal powder 30. Furthermore, by preforming the metal powder by cold pressing, metal layer 30 with a flat surface can be formed. When sintering, it is preferable that the cold pressing before the sintering be done with a compacting pressure of 196 MPa (2000 kgf/cm$^2$) or more and the sintering be done at a sintering temperature of 600° C., or the cold pressing before the sintering be done with a compacting pressure of 9.8 MPa (100 kgf/cm$^2$) or more and the sintering be done at a sintering temperature of 700° C., which can form metal layer 30 which is dense and provides large adhesion strength. Cold pressing done with larger compacting pressure and higher sintering temperature help to form metal layer 30 which is dense and provides excellent adhesion. The sintering temperature's upper limit is set to the melting point or less of metal powder 300.

It is mentioned that the sintering time is for example 10 minutes or more and 10 hours or less. Cold pressing done with larger compacting pressure and higher sintering temperature have a tendency allowing the sintering time to be reduced. Furthermore, while the sintering may be done in an atmosphere of the atmospheric air, in view of preventing oxidation of composite material 20 and metal powder 300, an inert gas (e.g., Ar gas) atmosphere and a vacuum atmosphere are preferable. Note that when Ag is adopted as a constituent metal of the metal matrix and the metal layer, they are not easily oxidized and even when the sintering is implemented in the atmospheric air, a problem by oxidation is not easily caused.

Preferably, the conditions of the hot pressing (the temperature and pressure of the hot pressing) and the conditions of the sintering (the compacting pressure of the cold pressing and the sintering temperature) are set as appropriate depending on the material of metal powder 300. When metal powder 300 is composed of a metal of Ag, and metal powder 300 is heated to form metal layer 30, oxide film is not easily formed on a surface of metal particle 301 and large adhesion is achieved and it is easy to form a metal layer having metal particles bonded via a metallic bond. It is easy to form metal layer 30. Thus metal powder 300 of a metal of Ag, as compared with other metals such as Cu and Al, more easily forms a metal layer which is dense and provides large adhesion even at low temperature.

Based on the method of producing a heat radiating member according to the embodiment of the present invention described above, a heat radiating member was produced and assessed.

<Exemplary Test 1>

Using a variety of composite materials and metal powders, hot pressing and sintering were done under various conditions to attempt to form a metal layer on an upper surface of each composite material. In exemplary test 1, Ag/diamond and Ag/SiC were prepared as composite materials. Ag/diamond is a composite material in which the metal matrix is Ag and the satisfactorily thermally conductive material's particles are diamond, and Ag/SiC is a composite material in which the metal matrix is Ag and the satisfactorily thermally conductive material's particles are SiC.

Figure 3:
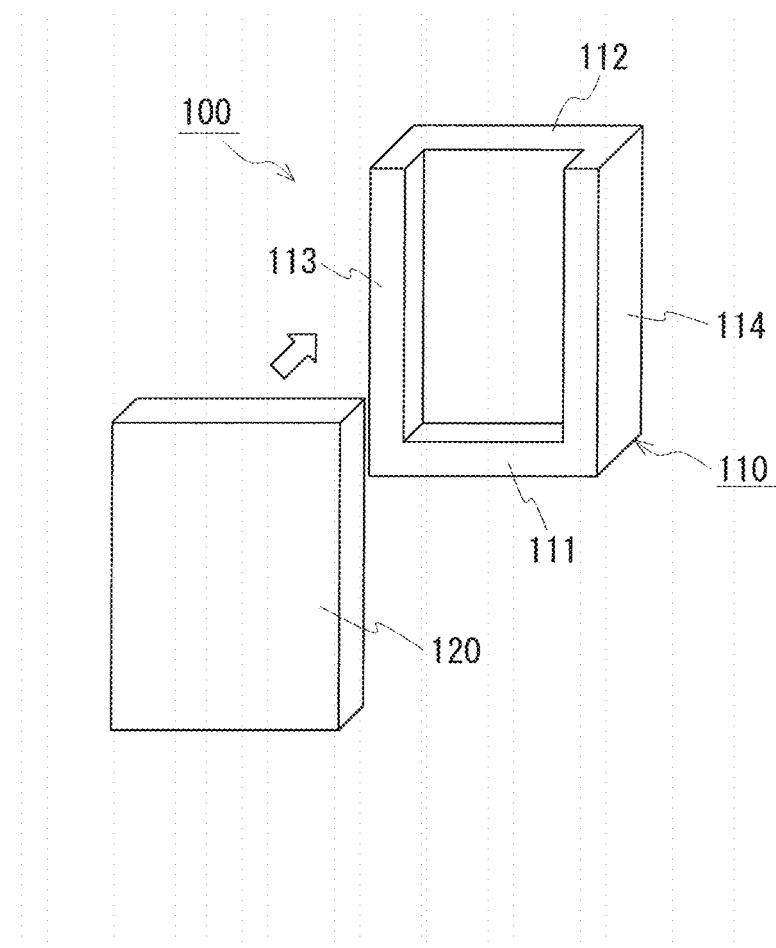
FIG. 3 is a schematic perspective view showing an example of a mold used for producing a composite material.

The Ag/diamond composite material was produced in the method described using FIG. 3 and FIG. 4. A diamond powder of coarse particles of diamond particles having an average particle size of 45 μm and a diamond powder of fine particles of diamond particles having an average particle size of 10 μm were prepared, and a diamond powder in which the coarse particles and the fine particles were mixed at a ratio (in volume) of 7:3 was prepared. An Ag powder having an average particle size of 20 μm was prepared. Furthermore, a Ti powder having an average particle size of 10 μm was prepared as an additive. And as a raw material powder, the diamond powder, the Ag powder, and the Ti powder were provided at a volume ratio of 60:38:2. In this raw material powder, relative to 60 volume % of the diamond powder, the Ti powder was mixed at a ratio of 1.5 volume % to adjust a particulate material of a satisfactorily thermally conductive material, and relative to 38 volume % of the Ag powder, the Ti powder was mixed at a ratio of 0.5 volume % to adjust a metal material for the matrix. A mold as shown in FIG. 3 is used, and as shown in FIG. 4, the particulate material of the satisfactorily thermally conductive material was introduced into the mold and thereafter the metal material for the matrix was disposed thereon. And the mold was heated to melt the Ag and thus infiltrate the Ag between the diamond particles, and thereafter, in order to suppress defects (e.g., shrinkage cavity) attributed to solidification shrinkage, solidification is done while applying a pressure of 30 MPa to the feeding head portion to produce Ag/diamond. The produced Ag/diamond had a shape in the form of a plate and was sized to have a width×a length×a thickness of 100 mm×100 mm×1 mm.

After the solidification, the produced composite material can be rolled or the like to squash pores present in the composite material or the like to remove a defect resulting from solidification shrinkage.

The produced Ag/diamond's thermal conductivity and coefficient of thermal expansion were measured to be 650 W/m·K and 6.5 ppm/K, respectively. The thermal conductivity is a value obtained by measuring a thermal conductivity at a room temperature (25° C.) with a laser flash type thermal conductivity measuring device, and the coefficient of thermal expansion is a value obtained by measuring a coefficient of linear expansion for 30° C. to 150° C. with a differential transformer transducer type thermodilatometer. Furthermore, arithmetic mean roughness Ra of an upper surface of the produced Ag/diamond was measured to be about 5 μm to 9 μm. Let this Ag/diamond be a composite material A1.

An Ag/SiC composite material was produced similarly as the Ag/diamond composite material was produced, except that the diamond powder was changed to a SiC powder. The produced Ag/SiC's thermal conductivity and coefficient of thermal expansion were measured to be 370 W/m·K and 7.5 ppm/K, respectively. Furthermore, arithmetic mean roughness Ra of an upper surface of the Ag/SiC was measured to be about 5 μm to 9 μm. Let this Ag/SiC be a composite material A2.

Exemplary Test 1-1

As a metal powder which forms the metal layer, an Ag powder having Ag particles with an average particle size of 20 μm was prepared. This Ag powder is an atomized powder having a purity of 99.8 mass % or more, and in metal particle 301 has metal crystal grains having an average crystal grain size of 30 μm or less. In exemplary test 1-1, the Ag powder was placed on an upper surface of each of composite materials A1 and A2 produced, and then hot pressing was performed to form a 100-μm-thick Ag layer as a metal layer. And as shown in table 1, the hot pressing was performed with pressure and temperature variously varied to assess the metal layer's adhesion for each pressure and each temperature. The hot pressing's pressing time was 10 minutes. The metal layer's adhesion by the hot pressing was assessed such that a case where the metal layer adhered and was bonded is "A", a case where the metal layer was partially bonded is "B", and a case where the metal layer did not adhere and was thus not bonded is "C". A result thereof is shown in table 1. The hot pressing was done in atmospheres of Ar, vacuum, and atmospheric air, and in all of the atmospheres, provided substantially the same results.

TABLE 1

|  |  | hot pressing temperature (° C.) | | | | | | | | |
|---|---|---|---|---|---|---|---|---|---|---|
|  |  | 100 | 200 | 300 | 400 | 500 | 600 | 700 | 800 | 900 |
| hot pressing pressure [MPa (kgf/cm²)] | 0.98 (10) | C | C | B | B | B | B | A | A | A |
|  | 9.8 (100) | C | C | B | B | A | A | A | A | A |
|  | 19.6 (200) | C | C | B | A | A | A | A | A | A |
|  | 49 (500) | C | C | B | A | A | A | A | A | A |
|  | 98 (1000) | C | C | A | A | A | A | A | A | A |
|  | 196 (2000) | C | B | A | A | A | A | A | A | A |
|  | 294 (3000) | C | B | A | A | A | A | A | A | A |
|  | 490 (5000) | C | B | A | A | A | A | A | A | A |
|  | 980 (10000) | C | B | A | A | A | A | A | A | A |

Exemplary Test 1-2

In exemplary test 1-2, the same Ag powder as exemplary test 1-1 was used, and the Ag powder was placed on an upper surface of each of composite materials A1 and A2 produced and cold pressing was performed, and thereafter, sintering was performed to form a 100-μm-thick Ag layer as a metal layer. And as shown in Table 2, the sintering was performed, with the cold pressing's compacting pressure and the sintering temperature variously varied, to assess the metal layer's adhesion for each compacting pressure and each sintering temperature. The sintering was done for 120 minutes. The metal layer's adhesion by the sintering was assessed such that a case where the metal layer was densified and bonded is "A", a case where the metal layer was not densified but bonded is "B", a case where the metal layer was neither densified nor bonded is "C". A result thereof is shown in table 2. The sintering was done in atmospheres of Ar, vacuum, and atmospheric air, and in all of the atmospheres, provided substantially the same results.

TABLE 2

|  |  | sintering temperature (° C.) | | | | | | | | |
|---|---|---|---|---|---|---|---|---|---|---|
|  |  | 100 | 200 | 300 | 400 | 500 | 600 | 700 | 800 | 900 |
| compacting pressure [MPa (kgf/cm²)] | 0.98 (10) | C | C | C | C | B | B | B | B | B |
|  | 9.8 (100) | C | C | C | C | B | B | A | A | A |
|  | 19.6 (200) | C | C | C | C | B | B | A | A | A |
|  | 49 (500) | C | C | C | C | B | B | A | A | A |
|  | 98 (1000) | C | C | C | C | B | B | A | A | A |
|  | 196 (2000) | C | C | C | C | B | A | A | A | A |
|  | 294 (3000) | C | C | C | C | B | A | A | A | A |
|  | 490 (5000) | C | C | C | C | A | A | A | A | A |
|  | 980 (10000) | C | C | C | C | A | A | A | A | A |

Exemplary Test 2

In exemplary test 2, Cu/diamond and Cu/SiC were prepared as composite materials. Cu/diamond is a composite material in which the metal matrix is Cu and the satisfactorily thermally conductive material's particles are diamond particles, and Cu/SiC is a composite material in which the metal matrix is Cu and the satisfactorily thermally conductive material's particles are SiC particles. A Cu/diamond composite material and a Cu/SiC composite material were produced similarly as the Ag/diamond composite material and Ag/SiC composite material of exemplary test 1 were produced, except that the Ag powder of the metal material for the matrix was changed to Cu powder.

The produced Cu/diamond's thermal conductivity and coefficient of thermal expansion were measured to be 550 W/m·K and 6.0 ppm/K, respectively. Furthermore, arithmetic mean roughness Ra of an upper surface of the Cu/diamond was measured to be about 5 μm to 9 μm. Let this Cu/diamond be a composite material B1. The produced Cu/SiC's thermal conductivity and coefficient of thermal expansion were measured to be 320 W/m·K and 6.5 ppm/K, respectively. Furthermore, arithmetic mean roughness Ra of an upper surface of the Cu/SiC was measured to be about 5 μm to 9 μm. Let this Cu/SiC be a composite material B2.

Exemplary Test 2-1

As a metal powder which forms the metal layer, a Cu powder having Cu particles with an average particle size of 5 μm was prepared. This Cu powder is an atomized powder having a purity of 99.8 mass % or more, and in metal particle 301 has metal crystal grains having an average crystal grain size of 30 μm or less. In exemplary test 2-1, the Cu powder was placed on an upper surface of each of composite materials B1 and B2 produced and hot pressing was performed to form a 100-μm-thick Cu layer as a metal layer. Then, as shown in table 3, the hot pressing was performed with pressure and temperature variously varied to assess the metal layer's adhesion for each pressure and each temperature similarly as done in exemplary test 1-1. A result thereof is shown in table 3. The hot pressing's pressing time was 10 minutes. The hot pressing was done in atmospheres of Ar and vacuum, and in both atmospheres, provided substantially the same results.

TABLE 3

| | | hot pressing temperature (° C.) | | | | | | | | |
|---|---|---|---|---|---|---|---|---|---|---|
| | | 100 | 200 | 300 | 400 | 500 | 600 | 700 | 800 | 900 |
| hot pressing pressure [MPa (kgf/cm$^2$)] | 0.98 (10) | C | C | C | C | C | B | B | A | A |
| | 9.8 (100) | C | C | C | C | C | B | A | A | A |
| | 19.6 (200) | C | C | C | C | B | A | A | A | A |
| | 49 (500) | C | C | C | C | B | A | A | A | A |
| | 98 (1000) | C | C | C | C | B | A | A | A | A |
| | 196 (2000) | C | C | C | B | A | A | A | A | A |
| | 294 (3000) | C | C | C | B | A | A | A | A | A |
| | 490 (5000) | C | C | C | B | A | A | A | A | A |
| | 980 (10000) | C | C | B | A | A | A | A | A | A |

Exemplary Test 2-2

In exemplary test 2-2, the same Cu powder as exemplary test 2-1 was used, and the Cu powder was placed on an upper surface of each of composite materials B1 and B2 produced and cold pressing was performed, and thereafter, sintering was performed to form a 100-μm-thick Cu layer as a metal layer. And as shown in Table 4, the sintering was performed, with the cold pressing's compacting pressure and the sintering temperature variously varied, to assess the metal layer's adhesion for each compacting pressure and each sintering temperature similarly as done in exemplary test 1-2. A result thereof is shown in table 4. The sintering was done for 120 minutes. The sintering was done in atmospheres of Ar and vacuum, and in both atmospheres, provided substantially the same results.

TABLE 4

| | | sintering temperature (° C.) | | | | | | | | |
|---|---|---|---|---|---|---|---|---|---|---|
| | | 100 | 200 | 300 | 400 | 500 | 600 | 700 | 800 | 900 |
| compacting pressure [MPa (kgf/cm$^2$)] | 0.98 (10) | C | C | C | C | C | C | B | B | B |
| | 9.8 (100) | C | C | C | C | C | C | B | A | A |
| | 19.6 (200) | C | C | C | C | C | B | B | A | A |
| | 49 (500) | C | C | C | C | C | B | B | A | A |
| | 98 (1000) | C | C | C | C | C | B | B | A | A |
| | 196 (2000) | C | C | C | C | C | B | B | A | A |
| | 294 (3000) | C | C | C | C | C | B | A | A | A |
| | 490 (5000) | C | C | C | C | C | B | A | A | A |
| | 980 (10000) | C | C | C | C | C | B | A | A | A |

Exemplary Test 3

In exemplary test 3, Al/diamond and Al/SiC were prepared as composite materials. Al/diamond is a composite material in which the metal matrix is Al and the satisfactorily thermally conductive material's particles are diamond particles, and Al/SiC is a composite material in which the metal matrix is Al and the satisfactorily thermally conductive material's particles are SiC particles. An Al/diamond composite material and an Al/SiC composite material were produced similarly as the Ag/diamond composite material and Ag/SiC composite material of exemplary test 1 were produced, except that the Ag powder of the metal material for the matrix was changed to an Al powder.

The produced Al/diamond's thermal conductivity and coefficient of thermal expansion were measured to be 550 W/m·K and 7.0 ppm/K, respectively. Furthermore, arithmetic mean roughness Ra of an upper surface of the Al/diamond was measured to be about 5 μm to 9 μm. Let this Al/diamond be a composite material C1. The produced Al/SiC's thermal conductivity and coefficient of thermal expansion were measured to be 180 W/m·K and 7.5 ppm/K, respectively. Furthermore, arithmetic mean roughness Ra of an upper surface of the Al/SiC was measured to be about 5 μm to 9 μm. Let this Al/SiC be a composite material C2.

Exemplary Test 3-1

As a metal powder which forms the metal layer, an Al powder having Al particles with an average particle size of 1.5 μm was prepared. This Al powder is an atomized powder having a purity of 99.8 mass % or more, and in metal particle 301 has metal crystal grains having an average crystal grain size of 30 μm or less. In exemplary test 3-1, the Al powder was placed on an upper surface of each of composite materials C1 and C2 produced and hot pressing was performed to form a 100-μm-thick Al layer as a metal layer. Then, as shown in table 5, the hot pressing was performed with pressure and temperature variously varied to assess the metal layer's adhesion for each pressure and each temperature similarly as done in exemplary test 1-1. A result thereof is shown in table 5. The hot pressing's pressing time was 10 minutes. The hot pressing was done in atmospheres of Ar and vacuum, and in both atmospheres, provided substantially the same results.

TABLE 5

|  |  | hot pressing temperature (° C.) | | | | | | |
|---|---|---|---|---|---|---|---|---|
|  |  | 100 | 200 | 300 | 400 | 500 | 600 | 700 |
| hot pressing pressure [MPa (kgf/cm$^2$)] | 0.98 (10) | C | C | C | B | A | A | A |
|  | 9.8 (100) | C | C | C | B | A | A | A |
|  | 19.6 (200) | C | C | C | B | A | A | A |
|  | 49 (500) | C | C | B | A | A | A | A |
|  | 98 (1000) | C | C | B | A | A | A | A |
|  | 196 (2000) | C | C | B | A | A | A | A |
|  | 294 (3000) | C | C | B | A | A | A | A |
|  | 490 (5000) | C | C | B | A | A | A | A |
|  | 980 (10000) | C | C | B | A | A | A | A |

Exemplary Test 3-2

In exemplary test 3-2, the same Al powder as exemplary test 3-1 was used, and the Al powder was placed on an upper surface of each of composite materials C1 and C2 produced and cold pressing was performed, and thereafter, sintering was performed to form a 100-μm-thick Al layer as a metal layer. And as shown in Table 6, the sintering was performed, with the cold pressing's compacting pressure and the sintering temperature variously varied, to assess the metal layer's adhesion for each compacting pressure and each sintering temperature similarly as done in exemplary test 1-2. A result thereof is shown in table 6. The sintering was done for 120 minutes. The sintering was done in atmospheres of Ar and vacuum, and in both atmospheres, provided substantially the same results.

TABLE 6

|  |  | sintering temperature (° C.) | | | | | | |
|---|---|---|---|---|---|---|---|---|
|  |  | 100 | 200 | 300 | 400 | 500 | 600 | 645 |
| compacting pressure [MPa (kgf/cm$^2$)] | 0.98 (10) | C | C | C | C | C | C | B |
|  | 9.8 (100) | C | C | C | C | C | C | B |
|  | 19.6 (200) | C | C | C | C | C | B | B |
|  | 49 (500) | C | C | C | C | C | B | A |
|  | 98 (1000) | C | C | C | C | B | A | A |
|  | 196 (2000) | C | C | C | C | B | A | A |
|  | 294 (3000) | C | C | C | C | B | A | A |
|  | 490 (5000) | C | C | C | C | B | A | A |
|  | 980 (10000) | C | C | C | C | B | A | A |

From the results of the above exemplary test 1 to exemplary test 3 is found the following: As shown in table 1 to table 6, it can be seen that, in any of hot pressing and sintering, by making the hot pressing temperature and the sintering temperature high, even when the hot pressing pressure and the compacting pressure are low, the metal layer can be formed from the metal powder. On the contrary, it can be seen that, by making the pressure high, the metal layer can be formed from the metal powder even at low temperature. From a result of comparing forming the metal layer by hot pressing (table 1, table 3, table 5) with forming the metal layer by sintering (table 2, table 4, table 6), it can be seen that, regardless of the material(s) of the metal powder which forms the metal layer, it is more possible for the hot pressing, rather than the sintering, to form the metal layer at low temperature. It can be seen that, as a metal powder which forms the metal layer, Ag (table 1, table 2) can form the metal layer even at low temperature and low pressure, as compared with Cu and Al (see table 2 to table 6). It is believed that this is because Ag discharges oxygen around 300° C., and as compared with Cu and Al, oxide film is not easily formed on surfaces of metal particles when the metal layer is formed.

Furthermore, from the results of table 1 to table 6, it can be seen that it is preferable to change a condition for the hot pressing and a condition for the sintering, as appropriate, for each material of the metal powder. In the case of hot pressing, for Ag, for example, a temperature of 300° C. or more and a pressure of 98 MPa (1000 kgf/cm$^2$) or more, or a temperature of 400° C. or more and a pressure of 19.6 MPa (200 kgf/cm$^2$) or more, are mentioned. For Cu, for example, a temperature of 500° C. or more and a pressure of 196 MPa (2000 kgf/cm$^2$) or more are mentioned. For Al, for example, a temperature of 400° C. or more and a pressure of 49 MPa (500 kgf/cm$^2$) or more are mentioned. In the case of sintering, for Ag, for example a compacting pressure of 196 MPa (2000 kgf/cm$^2$) or more and a sintering temperature of 600° C. or more, or a compacting pressure of 9.8 MPa (100 kgf/cm$^2$) or more and a sintering temperature of 700° C. or more, are mentioned. For Cu, for example, a compacting pressure of 294 MPa (3000 kgf/cm$^2$) or more and a sintering temperature of 700° C. or more are mentioned. For Al, for example, a compacting pressure of 98 MPa (1000 kgf/cm$^2$) or more and a sintering temperature of 600° C. or more are mentioned.

Exemplary Test 4

(Samples Nos. 1-1 to 1-21)

As a composite material, composite material A1 of Ag/diamond described for exemplary test 1 was prepared, and as a metal powder which forms the metal layer, an Ag powder having Ag particles having an average particle size of 20 μm was prepared. The Ag powder was placed on an upper surface of composite material A1 and hot pressing was performed under a condition indicated in table 7 to form a 100-μm-thick Ag layer as a metal layer to thus produce heat radiating members of samples Nos. 1-1 to 1-21 shown in table 7. In table 7, in the column "heating condition," in a case where "method" is hot pressing, "temperature" indicates the hot pressing's temperature, "pressure" indicates the hot pressing's pressure, and "time" indicates the hot pressing's pressing time (This also applies to table 9).

(Samples Nos. 1-22 to 1-34)

Ag powder was placed on an upper surface of composite material A1 and hot pressing was performed under a condition indicated in table 8 to form a 100-μm-thick Ag layer as a metal layer to thus produce heat radiating members of samples Nos. 1-22 to 1-34 shown in table 8. In table 8, in the column "heating condition," in a case where "method" is sintering, "temperature" indicates the sintering's temperature, "pressure" indicates a compacting pressure of cold pressing performed before the sintering, and "time" indicates the sintering's time (This also applies to table 9).

(Sample No. 1-35)

The heat radiating member of sample No. 1-35 shown in table 8 was formed such that a 100-μm-thick Ag foil was placed on an upper surface of composite material A1 and then hot pressing was performed under a condition indicated in table 8 to form a metal layer formed of the Ag foil.

(Sample No. 1-36)

In sample No. 1-36 shown in table 8, in producing the composite material, a metal layer composed of a metal component of the metal matrix was formed on an upper surface of the composite material. Specifically, it was produced as follows: the same raw material powder as composite material A1 was used and a material in which a diamond powder and a Ti powder were mixed together was previously sintered to produce a porous body of a skeleton structure in which diamond particles were coupled together via Ti and a Ti compound (e.g., TiC). The porous body of diamond particles was disposed in a mold such that a 400 μm gap was formed between a surface which will serve as an upper surface of the composite material and the mold. Subsequently, a metal material, in which an Ag powder and a Ti powder were mixed together, for the matrix was disposed on the porous body of diamond particles, and thereafter the mold was heated to melt the Ag and thus infiltrate the Ag between the diamond particles to produce Ag/diamond. This Ag/diamond has a metal layer formed of Ag of the metal matrix at the time of infiltration, and thus has an upper surface coated with the metal layer.

The heat radiating members of samples Nos. 1-1 to 1-35 and the heat radiating material of sample No. 1-36 were assessed as follows:

[Crystalline Structure]

A longitudinal cross section of each heat radiating member (and the heat radiating material) in the direction of the thickness was leveled by a CP (Cross section polisher) method and thereafter the cross section's crystalline structure was observed with an SEM and from the observed, cross-sectional image, an average crystal grain size of metal crystal grains in the metal layer was measured. Herein, 100 or more crystal grains were measured. Average crystal grain sizes of metal crystal grains measured are indicated in table 7 and table 8.

[Non-Bonded Area Ratio]

Each heat radiating member (and the heat radiating material) were scanned with an ultrasonic reflectscope, and a non-bonded area ratio of the composite portion and the metal layer was measured from an image reflected from a boundary of the composite portion and the metal layer. A result thereof is shown in table 7 and table 8. Note that regarding sample No. 1-36, a distribution of a gap inside the metal layer was investigated from a reflected image inside the metal layer to obtain the gap's distribution ratio (or area ratio). Specifically, in a region in which the metal layer was formed, an area ratio of the gap to an area in which the metal layer was formed was calculated. From the viewpoint of heat conduction, this gap is considered to be equivalent to a non-bonded portion of the composite portion and the metal layer, and accordingly, for sample No. 1-36, an area ratio of the gap obtained is indicated in table 8 at the column of "non-bonded area ratio" (this also applies to sample No. 2-16 of exemplary test 5 described later).

[Adhesion Strength]

A copper tape had one end soldered to a surface of the metal layer of the heat radiating member (and heat radiating material) and the copper tape was pulled in a direction of 90 degrees relative to the surface of the metal layer to measure the metal layer's peeling strength (adhesion strength). The measurement was done 5 times or more, and their average value was calculated. A result thereof is shown in table 7 and table 8.

[Roughness (Ra) of Surface]

Arithmetic mean roughness Ra of a surface of the metal layer was measured. A result thereof is shown in table 7 and table 8.

[Roughness (Ra) of Interface]

A longitudinal cross section of each heat radiating member (and the heat radiating material) was observed with an SEM, and from the observed, cross-sectional image, a contour curve of a bonding interface of the composite portion and the metal layer was extracted and the contour curve's arithmetic mean roughness Ra was measured. A measured value is indicated in table 7 and table 8 as an interface roughness of the composite portion and the metal layer. Note that sample No. 1-36 was not measured.

[Heat Cycle Endurance]

Each heat radiating member (and the heat radiating material) was immersed in a test liquid held at −60° C. for 10 minutes, and thereafter immersed in a test liquid held at 250° C. for 10 minutes, and this operation was set as 1 heat cycle and this heat cycle was performed 1000 times to observe whether the metal layer has a crack or other defects. Heat cycle endurance was assessed such that a case where no crack was observed is "A" and a case where a crack was observed is "B". A result thereof is shown in table 7 and table 8. As the test liquid, fluorine-based inert fluid ("Galden (registered trademark)", "Fluorinert (brand name)," etc. can be used.

[Heat Radiation]

In order to investigate how a hot spot is not easily formed when the heat radiating member (or material) is used with a semiconductor device bonded thereto, the following test was conducted. Of an upper surface on which the metal layer of the heat radiating member (or heat radiating material) was formed, a region having a diameter φ of 10 mm was irradiated with an infrared flash lamp such that 10 J/cm$^2$ was achieved. And an infrared camera was used to measure a cooling time elapsing until each portion in the irradiated surface of the metal layer was cooled to a temperature of [{(highest temperature immediately after irradiation)+(room temperature)}/2]. Heat radiation was assessed such that a case is "A" where in the surface a portion which has a size of 20 μm×20 μm or more and in which the cooling time is also larger by 20% or more than an average value of the entirety in the surface was not caused and a case is "B" where such a portion was caused. A result thereof is shown in table 7 and table 8.

TABLE 7

| sample No. | heating conditions | | | | crystal grain size (μm) | non-bonded area ratio (%) | adhesion strength (N/cm) | Ra of surface (μm) | Ra of interface (μm) | heat cycle endurance | heat radiation |
| --- | --- | --- | --- | --- | --- | --- | --- | --- | --- | --- | --- |
| | method | temperature (° C.) | pressure (MPa) | time (min) atmosphere | | | | | | | |
| 1-1 | hot pressing | 300 | 196 | 10 Ar | 8.4 | 0.01 | 30≥ | 0.7 | 7.0 | A | A |
| 1-2 | hot pressing | 400 | 196 | 10 Ar | 8.7 | 0.02 | 30≥ | 0.6 | 7.3 | A | A |
| 1-3 | hot pressing | 400 | 196 | 10 vacuum | 8.4 | 0.02 | 30≥ | 0.6 | 7.2 | A | A |
| 1-4 | hot pressing | 400 | 196 | 10 Air | 8.7 | 0.02 | 30≥ | 0.6 | 7.3 | A | A |
| 1-5 | hot pressing | 500 | 196 | 10 Ar | 8.7 | 0.02 | 30≥ | 0.5 | 7.1 | A | A |
| 1-6 | hot pressing | 600 | 196 | 10 Ar | 10.2 | 0.01 | 30≥ | 0.5 | 6.9 | A | A |
| 1-7 | hot pressing | 600 | 196 | 10 vacuum | 9.9 | 0.01 | 30≥ | 0.5 | 7.0 | A | A |
| 1-8 | hot pressing | 600 | 196 | 10 Air | 10.2 | 0.02 | 30≥ | 0.5 | 7.0 | A | A |
| 1-9 | hot pressing | 700 | 196 | 10 Ar | 12.5 | 0.01 | 30≥ | 0.4 | 7.3 | A | A |
| 1-10 | hot pressing | 800 | 196 | 10 Ar | 17.7 | 0.02 | 30≥ | 0.4 | 7.1 | A | A |
| 1-11 | hot pressing | 800 | 196 | 10 vacuum | 18.0 | 0.01 | 30≥ | 0.4 | 7.1 | A | A |
| 1-12 | hot pressing | 800 | 196 | 10 Air | 18.0 | 0.02 | 30≥ | 0.4 | 7.0 | A | A |
| 1-13 | hot pressing | 900 | 196 | 10 Ar | 21.8 | 0.02 | 30≥ | 0.3 | 7.2 | A | A |
| 1-14 | hot pressing | 400 | 196 | 1 Ar | 8.4 | 0.02 | 30≥ | 0.7 | 7.1 | A | A |
| 1-2 | hot pressing | 400 | 196 | 10 Ar | 8.7 | 0.02 | 30≥ | 0.6 | 7.3 | A | A |
| 1-15 | hot pressing | 400 | 196 | 30 Ar | 9.3 | 0.01 | 30≥ | 0.6 | 7.1 | A | A |
| 1-16 | hot pressing | 400 | 196 | 120 Ar | 9.6 | 0.01 | 30≥ | 0.5 | 7.1 | A | A |
| 1-17 | hot pressing | 400 | 19.6 | 10 Ar | 9.0 | 0.01 | 30≥ | 0.9 | 7.4 | A | A |
| 1-18 | hot pressing | 400 | 49 | 10 Ar | 8.7 | 0.02 | 30≥ | 0.8 | 7.0 | A | A |
| 1-19 | hot pressing | 400 | 98 | 10 Ar | 8.4 | 0.02 | 30≥ | 0.7 | 7.3 | A | A |
| 1-2 | hot pressing | 400 | 196 | 10 Ar | 8.7 | 0.02 | 30≥ | 0.6 | 7.0 | A | A |
| 1-20 | hot pressing | 400 | 490 | 10 Ar | 9.0 | 0.01 | 30≥ | 0.4 | 7.4 | A | A |
| 1-21 | hot pressing | 400 | 980 | 10 Ar | 8.7 | 0.01 | 30≥ | 0.2 | 6.9 | A | A |

TABLE 8

| | | heating conditions | | | | assessment result | | | | | | |
|---|---|---|---|---|---|---|---|---|---|---|---|---|
| sample No. | method | temperature (° C.) | pressure (MPa) | time (min) | atmosphere | crystal grain size (μm) | non-bonded area ratio (%) | adhesion strength (N/cm) | Ra of surface (μm) | Ra of interface (μm) | heat cycle endurance | heat radiation |
| 1-22 | sintering | 600 | 196 | 120 | Ar | 9.6 | 0.02 | 30≥ | 0.9 | 7.4 | A | A |
| 1-23 | sintering | 600 | 196 | 120 | vacuum | 9.6 | 0.02 | 30≥ | 0.9 | 7.2 | A | A |
| 1-24 | sintering | 600 | 196 | 120 | Air | 9.9 | 0.03 | 30≥ | 0.9 | 7.0 | A | A |
| 1-25 | sintering | 700 | 196 | 120 | Ar | 11.9 | 0.02 | 30≥ | 0.8 | 7.2 | A | A |
| 1-26 | sintering | 800 | 196 | 120 | Ar | 17.4 | 0.03 | 30≥ | 0.8 | 7.1 | A | A |
| 1-27 | sintering | 800 | 196 | 120 | vacuum | 18.0 | 0.02 | 30≥ | 0.8 | 7.0 | A | A |
| 1-28 | sintering | 800 | 196 | 120 | Air | 17.7 | 0.03 | 30≥ | 0.8 | 7.1 | A | A |
| 1-29 | sintering | 900 | 196 | 120 | Ar | 20.0 | 0.02 | 30≥ | 0.7 | 7.0 | A | A |
| 1-30 | sintering | 900 | 19.6 | 120 | Ar | 20.0 | 0.04 | 30≥ | 0.9 | 7.4 | A | A |
| 1-31 | sintering | 900 | 49 | 120 | Ar | 20.0 | 0.03 | 30≥ | 0.8 | 7.0 | A | A |
| 1-32 | sintering | 900 | 98 | 120 | Ar | 20.3 | 0.03 | 30≥ | 0.8 | 7.2 | A | A |
| 1-29 | sintering | 900 | 196 | 120 | Ar | 20.0 | 0.02 | 30≥ | 0.7 | 7.0 | A | A |
| 1-33 | sintering | 900 | 490 | 120 | Ar | 20.6 | 0.02 | 30≥ | 0.6 | 7.0 | A | A |
| 1-34 | sintering | 900 | 980 | 120 | Ar | 20.6 | 0.01 | 30≥ | 0.5 | 7.1 | A | A |
| 1-35 | foil + hot pressing | 400 | 196 | 10 | Ar | 58 | 0.5 | 26 | 0.7 | 7.1 | B | B |
| 1-36 | formed when infiltrated | — | — | — | — | >200 | 0.1 | 30≥ | 1.5 | — | B | A |

Samples Nos. 1-1 to 1-34 in which a composite material of Ag/diamond is used and Ag powder is hot pressed or sintered thereto to form a metal layer all have their metal layers with metal crystal grains having an average crystal grain size satisfying 30 μm or less. And it can be seen that samples Nos. 1-1 to 1-34 all have a non-bonded area ratio less than 0.5% and an adhesion strength of 30 N/cm or more. Furthermore, the metal layer has a surface with roughness Ra of 1 μm or less and it can be seen that the metal layer has a flat surface. From the assessment result of heat cycle endurance and heat radiation, samples Nos. 1-1 to 1-34 all have excellent heat cycle endurance and also present sufficient heat radiation.

In contrast, sample No. 1-35 in which an Ag foil was hot pressed to form a metal layer has the metal layer with metal crystal grains having an average crystal grain size exceeding 30 μm. Furthermore, it has a non-bonded area ratio of 0.5% or more, and does not have sufficient adhesion strength. And sample No. 1-35 is inferior in heat cycle endurance and also presents inferior heat radiation. In contrast, sample No. 1-36 in which a metal layer composed of the Ag of the metal matrix was formed at the time of infiltration has the metal layer with metal crystal grains having an average crystal grain size exceeding 30 μm, more specifically, exceeding 200 μm, and is inferior in heat cycle endurance. Note that in sample No. 1-36, many metal crystal grains are significantly large, exceeding 200 μm, and the metal crystal grain was larger than the field of view of the observed SEM image, and an accurate crystal grain size could not be obtained. Accordingly, it was indicated in table 8 at the column of "crystal grain size" as ">200" (this also applies to table 9).

Figure 5:
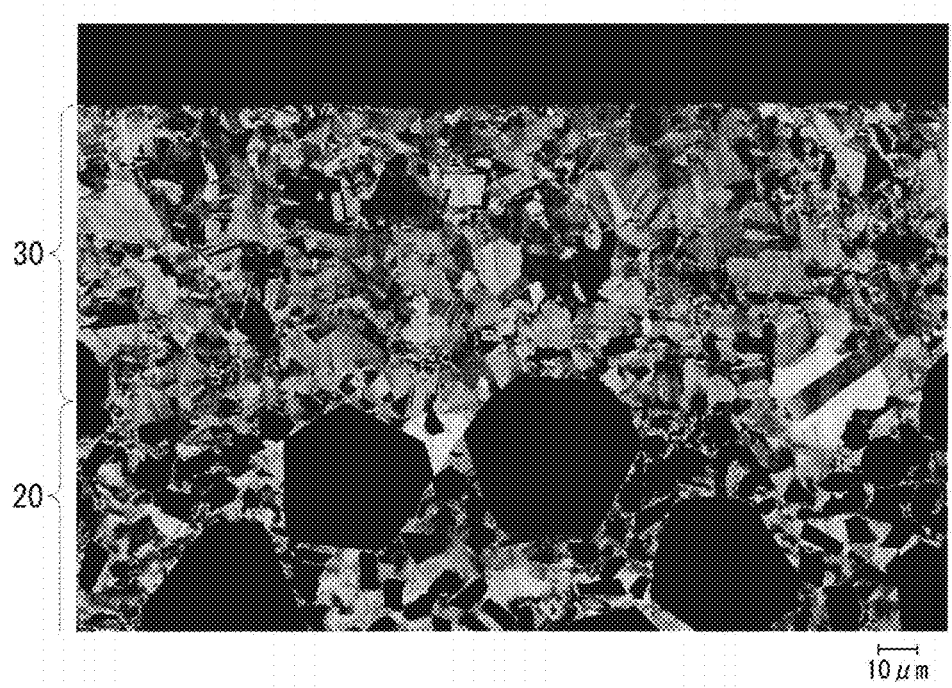
FIG. 5 is an image of a heat radiating member of sample No. 1-2 produced in an exemplary test 4, as observed in cross section via a scanning electron microscope (SEM).
Figure 6:
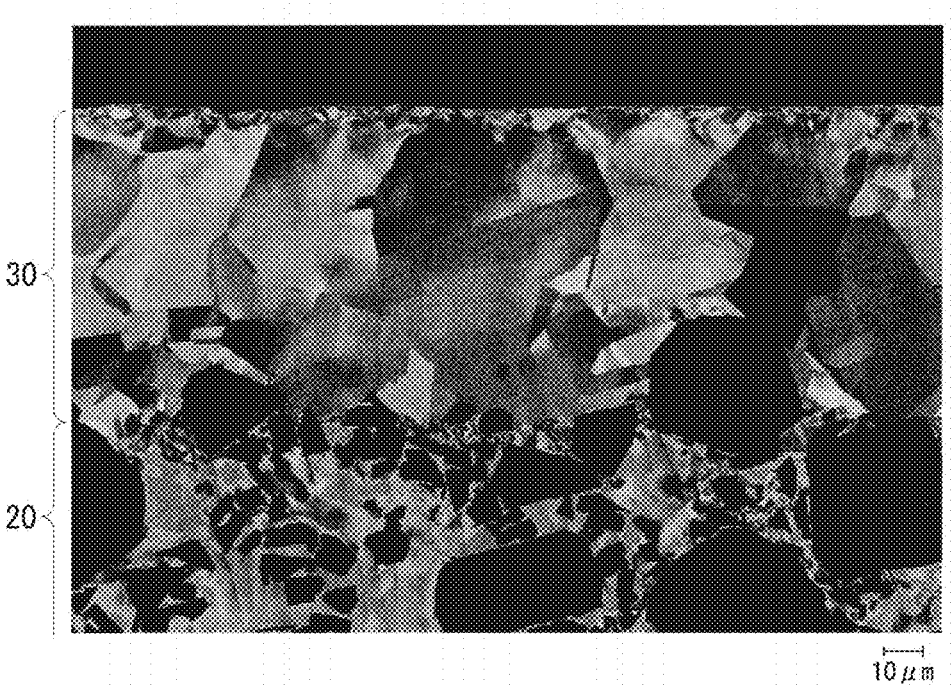
FIG. 6 is an image of a heat radiating member of sample No. 1-35 produced in exemplary test 4, as observed in cross section via an SEM.
Figure 7:
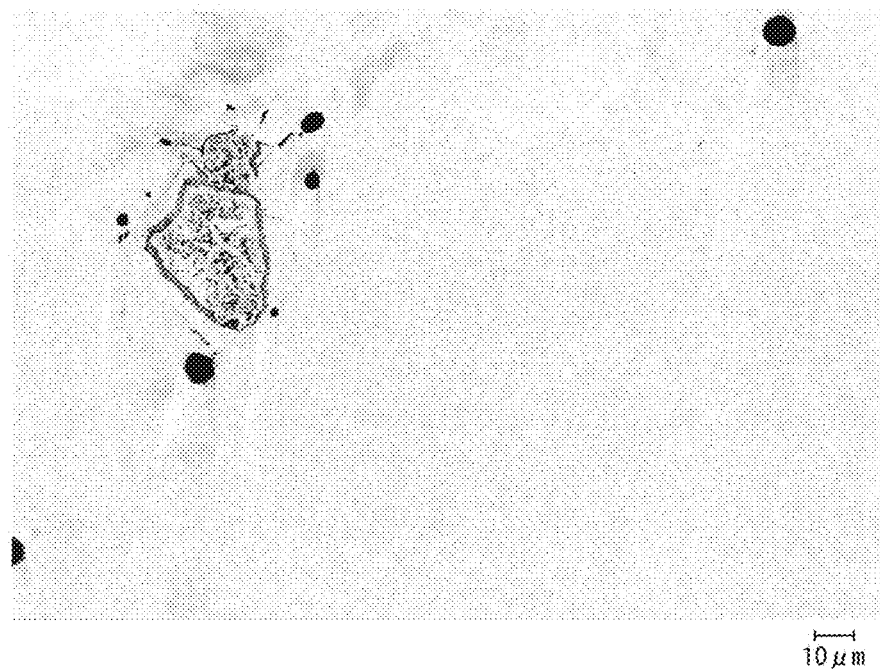
FIG. 7 is an image of a heat radiating member of sample No. 1-36 produced in exemplary test 4, as observed in cross section via an SEM.

FIGS. 5 and 6 show SEM images in cross section of the heat radiating members of samples Nos. 1-2 and 1-35 in a vicinity of an upper surface thereof. In each of FIG. 5 and FIG. 6, an upper portion of the figure shows metal layer 30 and a lower portion thereof shows composite portion 20, and black particles in composite portion 20 in the figures are diamond particles (satisfactorily thermally conductive material particles). From FIG. 5 and FIG. 6, it can be seen that in sample No. 1-2 in which the metal layer is formed using a metal powder (see FIG. 5), metal layer 30 has small metal crystal grains, whereas in sample No. 1-35 in which the metal layer is formed using a metal foil (see FIG. 6), metal layer 30 has large metal crystal grains. FIG. 7 shows an SEM image in cross section of the metal layer on an upper surface of the heat radiating material of sample No. 1-36. As shown in FIG. 7, it can be seen that when the metal layer is formed at the time of infiltration together with the metal matrix, the metal layer has significantly large metal crystal grains. Furthermore, in sample No. 1-36, as a result of an investigation by an ultrasonic reflectscope, it has been confirmed that a gap is present in the metal layer, and an area ratio of the gap in the metal layer (corresponding to the non-bonded area ratio) was 0.1%. From this matter, it is believed that when the metal layer is formed at the time of infiltration by the metal matrix, defects such as shrinkage cavity, gas hole, etc. are easily caused in the metal layer's portion and there is a tendency to easily form more or less space in the metal layer.

When samples in which the metal layer is formed by hot pressing are compared, it can be seen from a result of comparing samples Nos. 1-1 to 1-13 that hot pressing done at higher temperature has a tendency to provide metal crystal grains having a coarse crystal grain size. It can be seen that making the hot pressing's temperature low can suppress coarsening of metal crystal grains in the metal layer. From a result of comparing samples Nos. 1-2 and 1-14 to 1-16, hot pressing having a longer pressing time has a tendency to provide metal crystal grains having a slightly larger crystal grain size. From a result of comparing samples Nos. 1-2 and 1-17 to 1-21, it can be seen that hot pressing having larger pressure can reduce surface roughness.

When samples in which the metal layer is formed by sintering are compared, from a result of comparing samples Nos. 1-22 to 1-29, higher sintering temperature has a tendency to provide metal crystal grains having a coarse crystal grain size. In contrast, from a result of comparing samples Nos. 1-29 and 1-30 to 1-34, it can be seen that cold pressing done with larger compacting pressure can reduce surface roughness.

Exemplary Test 5

(Samples Nos. 2-1 to 2-8)

As a composite material, composite material C1 of Al/diamond described for exemplary test 3 was prepared, and as a metal powder which forms the metal layer, an Al powder having Al particles having an average particle size of 1.5 μm was prepared. The Al powder was placed on an upper surface of composite material C1 and hot pressing was performed under a condition indicated in table 9 to form a 100-μm-thick Al layer as a metal layer to thus produce heat radiating members of samples Nos. 2-1 to 2-8 shown in table 9.

(Samples Nos. 2-9 to 2-14)

Al powder was placed on an upper surface of composite material C1 and hot pressing was performed under a condition indicated in table 9 to form a 100-μm-thick Al layer as a metal layer to thus produce heat radiating members of samples Nos. 2-9 to 2-14 shown in table 9.

(Sample No. 2-15)

The heat radiating member of sample No. 2-15 was formed such that a 100-μm-thick Al foil was placed on an upper surface of composite material C1 and hot pressing was then performed under a condition indicated in table 9 to form a metal layer formed of the Al foil.

(Sample No. 2-16)

In sample No. 2-16, as well as sample No. 1-36 described for exemplary test 4, a porous body of diamond particles was used, and in producing the composite material, a metal layer composed of a metal component of the metal matrix was formed on an upper surface of the composite material. This Al/diamond has the metal layer formed of Al of the metal matrix at the time of infiltration, and thus has an upper surface coated with the metal layer.

The heat radiating members of samples Nos. 2-1 to 2-15 produced and the heat radiating material of sample No. 2-16 were assessed similarly as done for exemplary test 4. A result thereof is shown in table 9.

Furthermore, the metal layer has a surface with roughness Ra of 1 μm or less, and it can be seen that the metal layer has a flat surface. From the assessment result of heat cycle endurance and heat radiation, samples Nos. 2-1 to 2-14 all have excellent heat cycle endurance and also present sufficient heat radiation.

In contrast, sample No. 2-15 in which an Al foil was hot pressed to form a metal layer has the metal layer with metal crystal grains having an average crystal grain size exceeding 30 μm. Furthermore, it has a non-bonded area ratio of 0.5% or more, and does not have sufficient adhesion strength. And sample No. 2-15 is inferior in heat cycle endurance and also presents inferior heat radiation. In contrast, sample No. 2-16 in which a metal layer composed of the Al of the metal matrix was formed at the time of infiltration has the metal layer with metal crystal grains having a significantly large average crystal grain size exceeding 200 μm and is inferior in heat cycle endurance. Furthermore, in sample No. 2-16, as a result of an investigation by an ultrasonic reflectscope, it has been confirmed that a gap is present in the metal layer, and an area ratio of the gap in the metal layer (corresponding to the non-bonded area ratio) was 0.11%.

As well as in exemplary test 4, even in a case where Al powder is used, when samples in which the metal layer is formed by hot pressing are compared, it can be seen from a result of comparing samples Nos. 2-1 to 2-4 that hot pressing done at higher temperature has a tendency to provide metal crystal grains having a coarse crystal grain size. From a result of comparing samples Nos. 2-1 and 2-5 to 2-8, it can be seen that hot pressing having larger pressure can reduce surface roughness.

Furthermore, when samples in which the metal layer is formed by sintering are compared, from a result of compar-

TABLE 9

| | | heating conditions | | | | | assessment result | | | | | |
|---|---|---|---|---|---|---|---|---|---|---|---|---|
| sample No. | method | temperature (° C.) | pressure (MPa) | time (min) | atmosphere | crystal grain size (μm) | non-bonded area ratio (%) | adhesion strength (N/cm) | Ra of surface (μm) | Ra of interface (μm) | heat cycle endurance | heat radiation |
| 2-1 | hot pressing | 400 | 196 | 10 | Ar | 11.9 | 0.04 | 30≥ | 0.8 | 7.4 | A | A |
| 2-2 | hot pressing | 500 | 196 | 10 | Ar | 11.9 | 0.04 | 30≥ | 0.6 | 7.3 | A | A |
| 2-3 | hot pressing | 600 | 196 | 10 | Ar | 13.1 | 0.02 | 30≥ | 0.6 | 7.2 | A | A |
| 2-4 | hot pressing | 645 | 196 | 10 | Ar | 15.4 | 0.03 | 30≥ | 0.5 | 7.5 | A | A |
| 2-5 | hot pressing | 400 | 49 | 10 | Ar | 11.6 | 0.03 | 30≥ | 0.9 | 7.2 | A | A |
| 2-6 | hot pressing | 400 | 98 | 10 | Ar | 11.3 | 0.03 | 30≥ | 0.8 | 7.5 | A | A |
| 2-1 | hot pressing | 400 | 196 | 10 | Ar | 11.9 | 0.04 | 30≥ | 0.7 | 7.2 | A | A |
| 2-7 | hot pressing | 400 | 490 | 10 | Ar | 12.2 | 0.03 | 30≥ | 0.6 | 7.5 | A | A |
| 2-8 | hot pressing | 400 | 980 | 10 | Ar | 11.6 | 0.03 | 30≥ | 0.3 | 7.1 | A | A |
| 2-9 | sintering | 600 | 196 | 120 | Ar | 12.5 | 0.03 | 30≥ | 1.0 | 7.5 | A | A |
| 2-10 | sintering | 645 | 196 | 120 | Ar | 15.1 | 0.04 | 30≥ | 0.9 | 7.4 | A | A |
| 2-11 | sintering | 645 | 49 | 120 | Ar | 23.2 | 0.05 | 30≥ | 0.9 | 7.2 | A | A |
| 2-12 | sintering | 645 | 98 | 120 | Ar | 23.5 | 0.05 | 30≥ | 0.9 | 7.4 | A | A |
| 2-10 | sintering | 645 | 196 | 120 | Ar | 22.9 | 0.04 | 30≥ | 0.7 | 7.2 | A | A |
| 2-13 | sintering | 645 | 490 | 120 | Ar | 23.5 | 0.03 | 30≥ | 0.8 | 7.1 | A | A |
| 2-14 | sintering | 645 | 980 | 120 | Ar | 23.8 | 0.03 | 30≥ | 0.7 | 7.2 | A | A |
| 2-15 | foil + hot pressing | 400 | 196 | 10 | Ar | 31 | 0.65 | 24 | 0.8 | 7.2 | B | B |
| 2-16 | formed when infiltrated | — | — | — | — | >200 | 0.11 | 30≥ | 1.6 | — | B | A |

Samples Nos. 2-1 to 2-14 in which a composite material of Al/diamond is used and Al powder is hot pressed or sintered thereto to form a metal layer all have their metal layers with metal crystal grains having an average crystal grain size satisfying 30 μm or less. And it can be seen that samples Nos. 2-1 to 2-14 all have a non-bonded area ratio less than 0.5% and an adhesion strength of 30 N/cm or more.

ing samples Nos. 2-9 to 2-10, higher sintering temperature has a tendency to provide metal crystal grains having coarse crystal grain size. From a result of comparing samples Nos. 2-10 and 2-11 to 2-14, it can be seen that cold pressing done with larger compacting pressure can reduce surface roughness.

Exemplary Test 6

The heat radiating members of samples Nos. 1-1 to 1-35 and the heat radiating material of sample No. 1-36 of exemplary test 4 indicated in table 7 and table 8, and the heat radiating members of samples Nos. 2-1 to 2-15 and the heat radiating material of sample No. 2-16 of exemplary test 5 indicated in table 9 underwent a heat cycle test and were assessed regarding an assessment of heat cycle endurance, i.e., thermal conductivity degradation rate (%) after the heat cycle test.

[Thermal Conductivity Degradation Rate (%) after Heat Cycle Test]

The thermal conductivity ($\lambda_1$) of the heat radiating member (or heat radiating material) before the heat cycle test was measured at a room temperature (25° C.) by a laser flash type thermal conductivity measuring device. Subsequently, the heat radiating member (or heat radiating material) was subjected to a heat cycle test in which −40° C. (10 minutes) and 200° C. (10 minutes) were set as one cycle, and this test was conducted for 1000 cycles. The heat cycle test was done using a liquid bath thermal shock chamber (TSE-11 produced by Espec Corp.), and as a test liquid, a fluorine-based inert fluid ("Galden (registered trademark)") was used. Subsequently, the thermal conductivity ($\lambda_2$) of the heat radiating member (or heat radiating material) after the heat cycle test was measured at a room temperature (25° C.) by the laser flash type thermal conductivity measuring device. And a thermal conductivity degradation rate (%) after the heat cycle test was calculated from thermal conductivities $\lambda_1$ and $\lambda_2$ before and after the heat cycle test. A result thereof is shown in table 10 and table 11.

TABLE 10

| sample No. | thermal conductivity (W/m · K) before heat cycle test [$\lambda_1$] | thermal conductivity (W/m · K) after heat cycle test [$\lambda_2$] | thermal conductivity degradation rate (%) |
|---|---|---|---|
| 1-1 | 570 | 550 | 3.5 |
| 1-2 | 575 | 548 | 4.7 |
| 1-3 | 578 | 563 | 2.6 |
| 1-4 | 580 | 573 | 1.2 |
| 1-5 | 573 | 561 | 2.1 |
| 1-6 | 570 | 560 | 1.8 |
| 1-7 | 563 | 535 | 5.0 |
| 1-8 | 580 | 551 | 5.0 |
| 1-9 | 578 | 572 | 1.0 |
| 1-10 | 570 | 568 | 0.4 |
| 1-11 | 576 | 572 | 0.7 |
| 1-12 | 580 | 572 | 1.4 |
| 1-13 | 573 | 570 | 0.5 |
| 1-14 | 578 | 569 | 1.6 |
| 1-15 | 569 | 560 | 1.6 |
| 1-16 | 578 | 575 | 0.5 |
| 1-17 | 580 | 572 | 1.4 |
| 1-18 | 590 | 588 | 0.3 |
| 1-19 | 578 | 576 | 0.3 |
| 1-20 | 575 | 570 | 0.9 |
| 1-21 | 573 | 571 | 0.3 |
| 1-22 | 571 | 567 | 0.7 |
| 1-23 | 580 | 572 | 1.4 |
| 1-24 | 595 | 580 | 2.5 |
| 1-25 | 578 | 566 | 2.1 |
| 1-26 | 573 | 570 | 0.5 |
| 1-27 | 578 | 560 | 3.1 |
| 1-28 | 585 | 575 | 1.7 |
| 1-29 | 573 | 570 | 0.5 |
| 1-30 | 575 | 571 | 0.7 |
| 1-31 | 580 | 575 | 0.9 |
| 1-32 | 568 | 565 | 0.5 |
| 1-33 | 575 | 570 | 0.9 |
| 1-34 | 580 | 580 | 0.0 |
| 1-35 | 560 | 500 | 10.7 |
| 1-36 | 550 | 490 | 10.9 |

TABLE 11

| sample No. | thermal conductivity (W/m · K) before heat cycle test [$\lambda_1$] | thermal conductivity (W/m · K) after heat cycle test [$\lambda_2$] | thermal conductivity degradation rate (%) |
|---|---|---|---|
| 2-1 | 473 | 457 | 3.4 |
| 2-2 | 477 | 462 | 3.2 |
| 2-3 | 474 | 458 | 3.4 |
| 2-4 | 475 | 459 | 3.5 |
| 2-5 | 477 | 458 | 3.9 |
| 2-6 | 473 | 453 | 4.2 |
| 2-7 | 478 | 464 | 2.9 |
| 2-8 | 469 | 447 | 4.7 |
| 2-9 | 468 | 446 | 4.7 |
| 2-10 | 469 | 450 | 4.0 |
| 2-11 | 467 | 451 | 3.4 |
| 2-12 | 472 | 461 | 2.2 |
| 2-13 | 478 | 463 | 3.2 |
| 2-14 | 476 | 460 | 3.5 |
| 2-15 | 467 | 418 | 10.5 |
| 2-16 | 468 | 419 | 10.5 |

Samples Nos. 1-1 to 1-34 in which a composite material of Ag/diamond is used and Ag powder is hot pressed or sintered thereto to form a metal layer and Samples Nos. 2-1 to 2-14 in which a composite material of Al/diamond is used and Al powder is hot pressed or sintered thereto to form a metal layer all have a post-heat cycle test thermal conductivity degradation rate (%) of 5% or less and it can be seen that they maintain high thermal conductivity after the heat cycle test.

In contrast, samples Nos. 1-35 and 2-15 in which a metal foil is hot pressed to form a metal layer have a post-heat cycle test thermal conductivity degradation rate (%) of 10% or more and it can be seen that they have larger reduction in thermal conductivity attributed to cold energy. It is believed that this is because the adhesion strength of the metal layer and the composite material is low and accordingly, thermal stress generated by the heat cycle causes fine interface peeling and thus prevents heat conduction. Furthermore, samples Nos. 1-36 and 2-16 in which the metal layer is formed of the metal matrix at the time of infiltration also have a post-heat cycle test thermal conductivity degradation rate (%) of 10% or more and it can be seen that they have larger reduction in thermal conductivity attributed to cold energy. It is believed that this is because the metal layer has coarse metal crystal grains, so that by the heat cycle, a microcrack is caused in the metal layer and heat conduction is prevented.

[Supplementary Notes]

In connection with an embodiment of the present invention described above, supplementary notes are further disclosed as below:

(Supplementary Note 1)

In a heat radiating member according to an embodiment of the present invention, a plating layer of metal may further be comprised on a surface of the metal layer. Since the metal layer is composed of metal, it can be easily electroplated.

(Supplementary Note 2)

In a heat radiating member according to an embodiment of the present invention, the composite portion (or composite material) may be warped. Having a controlled warping allows the heat radiating member and another member (a substrate, a semiconductor device, etc.) to be bonded together such that the members' adhesion is improved. For example, a heat radiating member in the form of a flat plate with at least one of upper and lower surfaces warped, is mentioned.

(Supplementary Note 3)

In a heat radiating member according to an embodiment of the present invention, a metal member may be buried in the composite portion (or composite material). Furthermore, a throughhole may be formed through the metal member. The metal member that is buried in the composite portion and thus integrated therewith can for example be bored to easily form a throughhole. Such a composite material can be produced by disposing the metal member together with the particulate material of the satisfactorily thermally conductive material such as diamond powder in the mold at a prescribed position before the infiltration. Furthermore, it is also possible to produce a composite material which has a throughhole by using a core.

(Supplementary Note 4)

In a heat radiating member according to an embodiment of the present invention, the composite portion (or composite material) may have a shape not only in a flat plate but also a three-dimensional complicated shape.

(Supplementary Note 5)

In a heat radiating member according to an embodiment of the present invention, the composite portion (or composite material) may contain 80 volume % or more of particles of the satisfactorily thermally conductive material such as diamond. When 80 volume % or more of satisfactorily thermally conductive material particles (diamond particles in particular) are contained, a substantially same coefficient of thermal expansion as ceramics such as AN, and a significantly high thermal conductivity etc. can be achieved. For example, in a case of Ag/diamond in which the metal matrix is silver and diamond particles are selected as the satisfactorily thermally conductive material particles, by containing 80 volume % or more of diamond particles, characteristics of a thermal conductivity of 700 W/m·K or more and a coefficient of thermal expansion of about 4 ppm/K can be achieved. In order to achieve a volume ratio of 80% or more, it is necessary to optimize a mixture ratio of fine particles and coarse particles of satisfactorily thermally conductive material particles, the fine and coarse particles' particle diameters, and how they are introduced.

(Supplementary Note 6)

In exemplary test 4 described above, sample No. 1-35 has been described in which an Ag foil is hot pressed on an upper surface of a composite material of Ag/diamond to form a metal layer. It is mentioned that in this sample, before the Ag foil is disposed, a powder, a foil, etc of a metal (e.g., Cu, etc.) having a melting point falling when it is alloyed with Ag is disposed on an upper surface of the composite material and the Ag foil is disposed and thus hot pressed. According to this, it is believed that the Ag foil and the metal are alloyed to form a phase of a low melting point, and by the hot pressing's temperature the low melting point phase melts and projections and depressions of a surface of the composite material can thus be buried, and a reduced non-bonded area ratio is provided. As a result, it is believed that adhesion strength can be improved and heat radiation is also improved.

(Supplementary Note 7)

For the composite material of Ag/diamond, a metal powder which composes the metal layer can also be Ag alloy powder other than Ag powder and the metal layer may be composed of an Ag alloy.

(Supplementary Note 8)

A metal powder may be deposited on an upper surface of the composite material by cold spray to form a metal layer.

(Supplementary Note 9)

When an element of group 4 of the periodic table, such as Ti, is added to the composite material, then, after the composite material is produced, the composite material may be subjected to a heat treatment to provide age precipitation of the added element which is a solid solution in the metal matrix. By reducing the amount of the solid solution of the added element in the metal matrix, thermal conductivity can be increased. Furthermore, the age precipitation of the added element which is a solid solution in the metal matrix can be done by a heat treatment (hot pressing and sintering) in forming the metal layer from a metal powder.

(Supplementary Note 10)

The composite material such as Ag/diamond can be sized to be 50 mm or more in width and 50 mm or more in length.

(Supplementary Note 11)

When a composite material of diamond, SiC, etc. is produced by infiltration, a powder of diamond, SiC, etc. may be sintered to produce a porous body of a skeleton structure in which particles of diamond, SiC, etc, are coupled together and a metal material for the matrix may be infiltrated into the porous body of the skeleton structure. In doing so, by firmly coupling the particles together, a reduced coefficient of thermal expansion can be achieved.

INDUSTRIAL APPLICABILITY

The heat radiating member of the present invention is applicable to a heat radiating member of a semiconductor element used for a CPU (a Central Processing Unit), a GPU (a Graphics Processing Unit), a HEMT (a High Electron Mobility Transistor), a chip set, a memory chip, etc. included in personal computers, and mobile electronic devices, etc. The method for producing the heat radiating member of the present invention is applicable to producing a heat radiating member which has satisfactory adhesion between a composite portion and a metal layer and has excellent heat cycle endurance.

REFERENCE SIGNS LIST

10: heat radiating member;
20: composite portion (composite material);
21: metal matrix;
22: particles of satisfactorily thermally conductive material;
30: metal layer;
100: mold;
110: body;
111: bottom;
112: rear wall;
113: right wall;
114: left wall;
120: lid (front wall);

210: metal material for matrix;
220: particulate material of satisfactorily thermally conductive material;
300: metal powder;
301: metal particle;

The invention claimed is:

1. A heat radiating member comprising:
a composite portion composed of a composite material which contains particles of a satisfactorily thermally conductive material in a metal matrix; and
metal layer formed on at least one surface of the composite portion and composed of Cu or an alloy thereof, wherein
the satisfactorily thermally conductive material is diamond,
the metal matrix is composed of Cu or an alloy thereof,
the composite portion has a thermal conductivity of 120 W/m·K or more,
the metal composing the metal layer has crystal grains having an average crystal grain size of 30 μm or less, and
the metal layer has a thickness of 10 μm or more and 500 μm or less.

2. The heat radiating member according to claim 1, wherein the metal matrix and the metal layer are composed of a metal which is at least one type of metal selected from Ag, Cu, Al, Mg, and Au or an alloy thereof.

3. The heat radiating member according to claim 1, wherein the metal layer is composed of a metal which is identical to a metal composing the metal matrix or an alloy containing 60 mass % or more of a metal identical to a metal of a major component composing the metal matrix.

4. The heat radiating member according to claim 1, wherein an adhesion strength of the metal layer for the composite portion is 30 N/cm or more.

5. The heat radiating member according to claim 1, wherein the metal layer has a surface with an arithmetic mean roughness Ra of 1 μm or less.

6. The heat radiating member according to claim 1, wherein the composite portion and the metal layer have a bonding interface having an arithmetic mean roughness Ra more than 1 μm.

7. The heat radiating member according to claim 1, wherein, in a region in which the metal layer is formed, a ratio in area of a non-bonded portion of the composite portion and the metal layer relative to an area in which the metal layer is formed is less than 0.5%.

8. The heat radiating member according to claim 1, wherein a thermal conductivity degradation rate after a heat cycle test of −40° C. and 200° C. is 5% or less.

9. A method for producing a heat radiating member, comprising:
a preparation step to prepare a composite material which contains particles of a satisfactorily thermally conductive material in a metal matrix;
a powder arrangement step to dispose a metal powder composed of metal particles on at least one surface of the composite material; and
a heating step to heat the composite material and the metal powder, with the metal powder disposed on the composite material, to form a metal layer composed of a metal of the metal powder on a composite portion composed of Cu or an alloy thereof, wherein
the satisfactorily thermally conductive material is diamond,
the metal matrix is composed of Cu or an alloy thereof,
the composite portion has a thermal conductivity of 120 W/m·K or more,
the metal composing the metal layer has crystal grains having an average crystal grain size of 30 μm or less; and
the metal layer has a thickness of 10 μm or more and 500 μm or less.

10. The method for producing a heat radiating member according to claim 9, wherein, in the heating step, the composite material and the metal powder are hot-pressed.

11. The method for producing a heat radiating member according to claim 10, wherein the hot pressing is performed at a temperature of 300° C. or higher with a pressure of 98 MPa or more.

12. The method for producing a heat radiating member according to claim 10, wherein the hot pressing is performed at a temperature of 400° C. or higher with a pressure of 19.6 MPa or more.

13. The method for producing a heat radiating member according to claim 10, comprising a powder compacting step in which, before the heating step, in a state where the metal powder is placed on the composite material, cold pressing is performed to preform the metal powder.

14. The method for producing a heat radiating member according to claim 9, comprising a powder compacting step in which, before the heating step, in a state where the metal powder is placed on the composite material, cold pressing is performed to preform the metal powder, wherein in the heating step, the composite material and the metal powder are sintered.

15. The method for producing a heat radiating member according to claim 14, wherein:
the cold pressing before the sintering is performed with a compacting pressure of 196 MPa or more; and
the sintering is performed at a temperature of 600° C. or more.

16. The method for producing a heat radiating member according to claim 14, wherein:
the cold pressing before the sintering is performed with a compacting pressure of 9.8 MPa or more; and
the sintering is performed at a temperature of 700° C. or more.

17. The method for producing a heat radiating member according to claim 9, wherein the metal powder is composed of a metal Ag.

18. The method for producing a heat radiating member according to claim 9, wherein the metal particles composing the metal powder have an average particle size of 1 μm or more and 40 μm or less.

* * * * *